(12) United States Patent
Nakai

(10) Patent No.: US 7,373,171 B2
(45) Date of Patent: *May 13, 2008

(54) FRONT END MODULE

(75) Inventor: Shinya Nakai, Tokyo (JP)

(73) Assignee: TDK Corporation, Tokyo (JP)

( * ) Notice: Subject to any disclaimer, the term of this patent is extended or adjusted under 35 U.S.C. 154(b) by 557 days.

This patent is subject to a terminal disclaimer.

(21) Appl. No.: 10/774,607

(22) Filed: Feb. 10, 2004

(65) Prior Publication Data

US 2004/0224643 A1 Nov. 11, 2004

(30) Foreign Application Priority Data

Feb. 14, 2003 (JP) ............................... 2003-37473

(51) Int. Cl.
*H04M 1/00* (2006.01)

(52) U.S. Cl. ..................... 455/552.1; 455/78; 455/80; 455/550.1; 455/553.1; 333/100; 333/103; 333/104

(58) Field of Classification Search ............ 455/78–83, 455/73, 550.1, 552.1, 553.1, 575.1, 7, 90.1–3; 333/100–104, 134, 175; 370/275, 278, 290–291, 370/286, 297, 246, 172, 185; 257/728, 760, 257/664, 347; 343/700 MS, 700 R, 701–702
See application file for complete search history.

(56) References Cited

U.S. PATENT DOCUMENTS

| | | | |
|---|---|---|---|
| 5,864,260 A | | 1/1999 | Lee |
| 6,366,564 B1 | * | 4/2002 | Hiraka et al. ............... 370/275 |
| 6,380,823 B1 | * | 4/2002 | Ikata et al. .................. 333/133 |
| 6,476,695 B1 | * | 11/2002 | Nakamichi ................... 333/246 |
| 6,633,748 B1 | * | 10/2003 | Watanabe et al. ............. 455/78 |
| 6,753,604 B1 | * | 6/2004 | Hase et al. ................. 257/728 |
| 6,759,924 B2 | * | 7/2004 | Sakuragawa et al. ....... 333/133 |
| 6,766,149 B1 | * | 7/2004 | Hikita et al. .................. 455/83 |
| 6,920,324 B2 | * | 7/2005 | Atarius et al. .............. 455/436 |
| 6,985,712 B2 | * | 1/2006 | Yamakawa et al. ......... 455/333 |
| 6,987,984 B1 | * | 1/2006 | Kemmochi et al. ...... 455/552.1 |
| 7,130,655 B2 | * | 10/2006 | Kemmochi et al. ...... 455/552.1 |
| 2002/0032038 A1 | | 3/2002 | Furutani et al. |
| 2003/0092397 A1 | * | 5/2003 | Uriu et al. .................... 455/82 |

FOREIGN PATENT DOCUMENTS

| | | |
|---|---|---|
| JP | A-08-191230 | 7/1996 |
| JP | A-09-307399 | 11/1997 |
| JP | A 11-255088 | 8/1999 |
| JP | A-2001-211097 | 8/2001 |
| JP | A 2002-43977 | 2/2002 |

* cited by examiner

*Primary Examiner*—Tuan Tran
(74) *Attorney, Agent, or Firm*—Oliff & Berridge, PLC

(57) ABSTRACT

A front end module comprises a diplexer, a first duplexer, and a second duplexer. The first duplexer is connected to the diplexer through a first high frequency switch and separates transmission signals and reception signals of the N-CDMA from each other. The second duplexer is connected to the diplexer through a second high frequency switch and separates transmission signals and reception signals of the W-CDMA from each other. Each of the duplexers includes acoustic wave elements. A single multi-layer substrate for integration is used to integrate the components of the front end module. The diplexer is made up of a conductor layer located inside or on the surface of the multi-layer substrate.

2 Claims, 24 Drawing Sheets

FRONT END MODULE

BACKGROUND OF THE INVENTION

1. Field of the Invention

The present invention relates to a front end module for processing transmission signals and reception signals in a communications device such as a cellular phone.

2. Description of the Related Art

Third-generation cellular phones have been introduced and it is getting required that such phones have not only the speech function but also the high-speed data communications function. Therefore, in various countries, adoption of a variety of multiplexing systems for achieving high-speed data communications is considered. In the current situation, however, it is difficult to unify the multiplexing systems. Consequently, it is required that the cellular phones be provided for multiple modes (systems) and multiple bands.

In Europe, for example, dual-band cellular phones operable under the global system for mobile communications (GSM) and the digital cellular system (DCS) have been used in the entire region. Each of the GSM and the DCS is a time division multiple access system. In Europe, as the third-generation cellular phones, it is expected that dual-mode, triple-band cellular phones are adopted, which are operable under the wideband code division multiple access (W-CDMA) capable of implementing a high data communication speed (2 Mbps, for example), in addition to the above-mentioned two systems.

If new functions as described above are added to the cellular phones, the circuits are more complicated and the number of components increases. Higher-density mounting techniques are thus required for the cellular phones. Under such a circumstance, it is necessary to achieve a reduction in size and weight of the components and to achieve combination and integration of the components for the high frequency circuits inside the cellular phones to reduce the mounting space.

The Published Unexamined Japanese Patent Application Heisei 11-225088 (1999) discloses a high frequency switch module for the dual-band cellular phones operable in the GSM and the DCS. This high frequency switch module separates the frequency band corresponding to the GSM and the frequency band corresponding to the DCS from each other through the use of a branching circuit, and separates transmission signals and reception signals in each of the frequency bands from each other through the use of two high frequency switches.

The Published Unexamined Japanese Patent Application 2002-43977 discloses a high frequency module for processing transmission signals and reception signals of each of three communications systems using three frequency bands. This high frequency module separates a low frequency band from a high frequency band through the use of a diplexer. The high frequency band includes the two frequency bands of the first and second communications systems. The low frequency band includes the frequency band of the third communications system. A first high frequency switch separates the reception signals of the first and second communications systems from the transmission signals of the first and second communications systems. A second high frequency switch separates the transmission signals and the reception signals of the third communications system from each other. Two SAW filters separate the reception signals of the first communications system from the reception signals of the second communications system. In addition, the Published Unexamined Japanese Patent Application 2002-43977 discloses that the components of the high frequency module are integrated through the use of a layered structure made up of a plurality of stacked sheet layers.

According to the high frequency switch module disclosed in the Published Unexamined Japanese Patent Application Heisei 11-225088, the high frequency switches are used to separate the transmission signals and the reception signals in each of the frequency bands from each other. According to the high frequency module disclosed in the Published Unexamined Japanese Patent Application 2002-43977, the high frequency switches are used to separate the transmission signals and the reception signals from each other, too. Therefore, the high frequency switch modules disclosed in those publications have a problem that they are not operable in the CDMA.

In the Published Unexamined Japanese Patent Application 2002-43977 the duplexers including two SAW filters for separating the reception signals of two communications systems are called SAW duplexers. However, duplexers generally mean those for separating transmission signals and reception signals from each other. In the embodiments of the invention those for separating transmission signals and reception signals from each other are called duplexers, too. Therefore, the SAW duplexers disclosed in the Published Unexamined Japanese Patent Application 2002-43977 are different from the duplexers of the embodiments of the present invention, in terms of function.

OBJECT AND SUMMARY OF THE INVENTION

It is an object of the invention to provide a front end module that is capable of processing transmission signals and reception signals in each of first and second frequency bands and operable in the code division multiple access system and that easily achieves a reduction in size and weight, and combination and integration of components.

A front end module of the invention is a module for processing transmission signals and reception signals in each of a first frequency band and a second frequency band. The front end module comprises: a first separating means connected to an antenna and separating the first and second frequency bands from each other; a second separating means connected to the first separating means, including two acoustic wave elements each of which functions as a filter, and separating the transmission signals and the reception signals in the first frequency band from each other; a third separating means connected to the first separating means, including two acoustic wave elements each of which functions as a filter, and separating the transmission signals and the reception signals in the second frequency band from each other; and a single multi-layer substrate for integrating the first to third separating means. The first separating means is made up of a conductor layer located inside or on a surface of the multi-layer substrate.

According to the front end module of the invention, the first separating means separates the first and second frequency bands from each other. The second separating means including the two acoustic wave elements separates the transmission signals and the reception signals in the first frequency band from each other. The third separating means including the two acoustic wave elements separates the transmission signals and the reception signals in the second frequency band from each other. The single multi-layer substrate is used to integrate the first to third separating means. In addition, the first separating means is made up of the conductor layer located inside or on the surface of the multi-layer substrate. The acoustic wave elements are those utilizing acoustic waves, and may be surface acoustic wave elements utilizing surface acoustic waves or bulk acoustic wave elements utilizing bulk acoustic waves.

According to the front end module of the invention, the two acoustic wave elements that the second separating means includes and the two acoustic wave elements that the third separating means includes may be mounted on the multi-layer substrate, and at least part of circuit portions of the second and third separating means except the acoustic wave elements may be made up of the conductor layer located inside or on the surface of the multi-layer substrate.

According to the front end module of the invention, the first separating means may incorporate: a filter for allowing signals of frequencies in the first frequency band to pass through this filter and intercepting signals of frequencies in the second frequency band; and a filter for allowing signals of frequencies in the second frequency band to pass through this filter and intercepting signals of frequencies in the first frequency band.

According to the front end module of the invention, the transmission signals and the reception signals in each of the first and second frequency bands may be signals of a code division multiple access system.

Other and further objects, features and advantages of the invention will appear more fully from the following description.

DESCRIPTION OF PREFERRED EMBODIMENTS

Preferred embodiments of the invention will now be described in detail with reference to the accompanying drawings.

First Embodiment

A front end module of a first embodiment of the invention will now be described. The front end module of the embodiment is a module that is operable in the GSM as a time division multiple access system, the DCS as a time division multiple access system, the W-CDMA as a code division multiple access system, and the narrow-band code division multiple access system (hereinafter called the N-CDMA) as a code division multiple access system, and that processes transmission signals and reception signals of these systems. The frequency band of transmission signals of the GSM is 880 to 915 MHz. The frequency band of reception signals of the GSM is 925 to 960 MHz. The frequency band of transmission signals of the DCS is 1710 to 1785 MHz. The frequency band of reception signals of the DCS is 1805 to 1880 MHz. The frequency band of transmission signals of the W-CDMA is 1920 to 1990 MHz. The frequency band of reception signals of the W-CDMA is 2110 to 2180 MHz. The frequency band of transmission signals of the N-CDMA is 824 to 849 MHz. The frequency band of reception signals of the N-CDMA is 869 to 894 MHz.

The frequency bands of transmission signals and reception signals of the N-CDMA correspond to the first frequency band of the invention. The frequency bands of transmission signals and reception signals of the W-CDMA correspond to the second frequency band of the invention.

Figure 1:
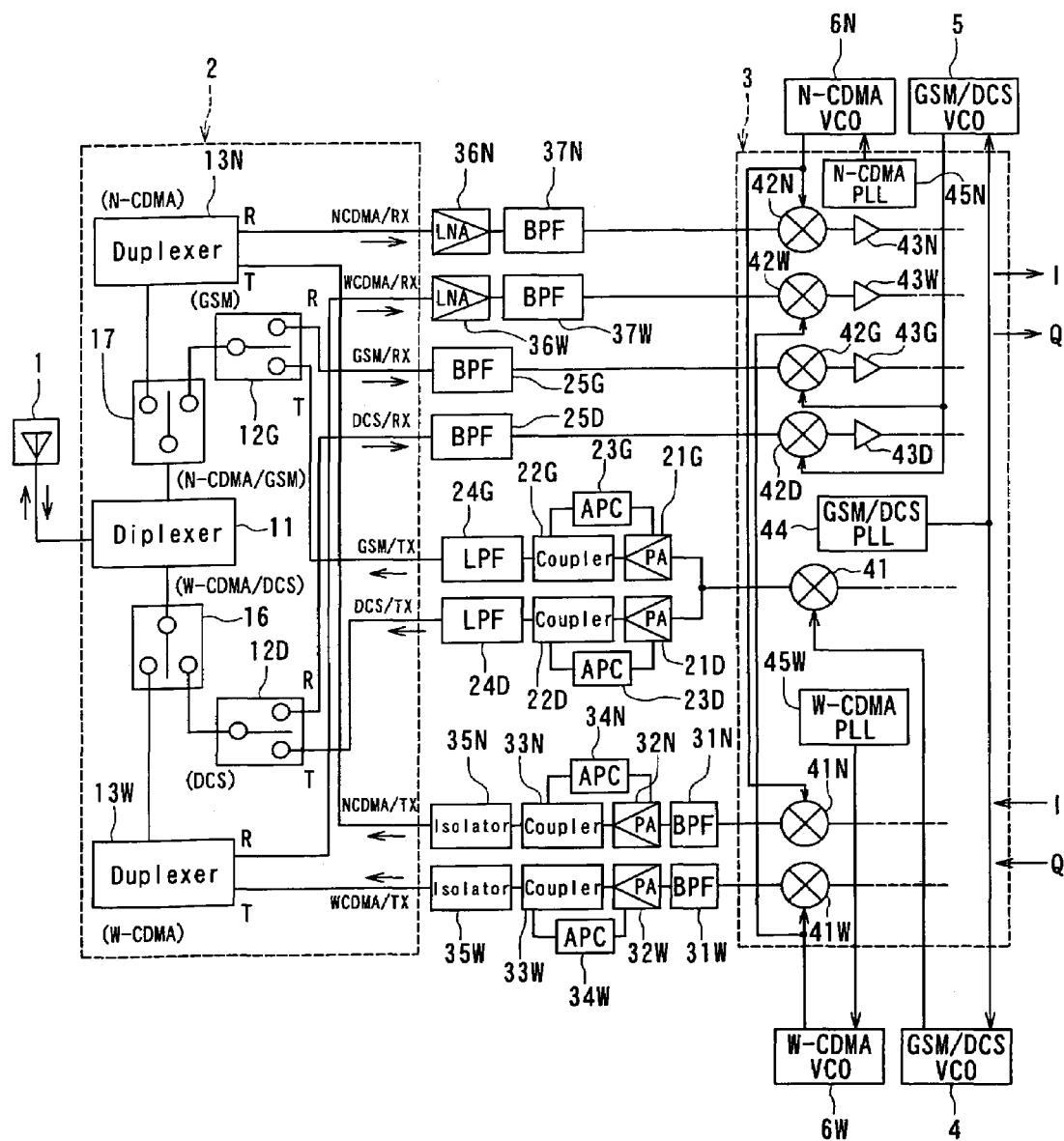
FIG. 1 is a block diagram illustrating an example of a high frequency circuit of a cellular phone including a front end module of a first embodiment of the invention.

Reference is now made to FIG. 1 to describe an example of a high frequency circuit of a cellular phone including the front end module of the embodiment. The high frequency circuit of FIG. 1 comprises an antenna 1, the front end module 2 of the embodiment connected to the antenna 1, and an integrated circuit 3 that mainly performs signal modulation and demodulation. The high frequency circuit further comprises two voltage controlled oscillators 4 and 5 for the GSM and the DCS, and a voltage controlled oscillator 6W for the W-CDMA, and a voltage controlled oscillator 6N for the N-CDMA. The voltage controlled oscillators 4, 5, 6W and 6N are connected to the integrated circuit 3.

The high frequency circuit further comprises: band-pass filters (hereinafter called BPFs) 25G and 25D each having an input connected to the front end module 2 and an output connected to the integrated circuit 3; a low-noise amplifier 36W having an input connected to the front end module 2; a BPF 37W having an input connected to an output of the low-noise amplifier 36W and an output connected to the integrated circuit 3; a low-noise amplifier 36N having an input connected to the front end module 2; and a BPF 37N having an input connected to an output of the low-noise amplifier 36N and an output connected to the integrated circuit 3. Each of the BPFs 25G, 25D, 37W and 37N is made up of an acoustic wave element.

The high frequency circuit further comprises: a power amplifier (indicated as PA in the drawings) 21G having an input connected to the integrated circuit 3; a coupler 22G having an input connected to an output of the power amplifier 21G; an automatic power control circuit (indicated as APC in the drawings) 23G for controlling the power amplifier 21G based on the output of the coupler 22G, so that the output gain of the power amplifier 21G is made constant; and a low-pass filter (hereinafter called an LPF) 24G having an input connected to the output of the coupler 22G and an output connected to the front end module 2. These components form a circuit for the GSM. The high frequency circuit further comprises a power amplifier 21D, a coupler 22D, an automatic power control circuit 23D and an LPF 24D for the DCS, which have the configuration the same as that of the above-mentioned circuit for the GSM.

The high frequency circuit further comprises: a BPF 31W having an input connected to the integrated circuit 3; a power amplifier 32W having an input connected to an output of the BPF 31W; a coupler 33W having an input connected to an output of the power amplifier 32W; an automatic power control circuit 34W for controlling the power amplifier 32W based on the output of the coupler 33W, so that the output gain of the power amplifier 32W is made constant; and an isolator 35W having an input connected to the output of the coupler 33W and an output connected to the front end module 2. These components form a circuit for the W-CDMA. The high frequency circuit further comprises a BPF 31N, a power amplifier 32N, a coupler 33N, an automatic power control circuit 34N and an isolator 35N for the N-CDMA, which have the configuration the same as that of the above-mentioned circuit for the W-CDMA. Each of the BPFs 31W and 31N is made up of an acoustic wave element.

The front end module 2 will now be described in detail. The front end module 2 comprises a diplexer 11, high frequency switches 16, 17, 12G and 12D, and duplexers 13W and 13N. The diplexer 11 corresponds to the first separating means of the invention. The duplexer 13N corresponds to the second separating means of the invention. The duplexer 13W corresponds to the third separating means of the invention.

The diplexer 11 has first to third ports. The first port is connected to the antenna 1. The second port is designed to receive and output N-CDMA signals and GSM signals. The third port is designed to receive and output W-CDMA signals and DCS signals.

The second port of the diplexer 11 is connected to a movable contact of the high frequency switch 17. The high frequency switch 17 has two fixed contacts one of which is connected to the duplexer 13N. The other one of the fixed contacts of the high frequency switch 17 is connected to a movable contact of the high frequency switch 12G. The high frequency switch 12G has two fixed contacts one of which (the one indicated with R) is connected to the input of the BPF 25G. The other one (the one indicated with T) of the fixed contacts of the high frequency switch 12G is connected to the output of the LPF 24G.

The third port of the diplexer 11 is connected to a movable contact of the high frequency switch 16. The high frequency switch 16 has two fixed contacts one of which is connected to the duplexer 13W. The other one of the fixed contacts of the high frequency switch 16 is connected to a movable contact of the high frequency switch 12D. The high frequency switch 12D has two fixed contacts one of which (the one indicated with R) is connected to the input of the BPF 25D. The other one (the one indicated with T) of the fixed contacts of the high frequency switch 12D is connected to the output of the LPF 24D.

The duplexer 13N has a common terminal, a reception terminal (the one indicated with R) and a transmission terminal (the one indicated with T). The common terminal of the duplexer 13N is connected to the one of the fixed contacts of the high frequency switch 17. The reception terminal of the duplexer 13N is connected to the input of the low-noise amplifier 36N. The transmission terminal of the duplexer 13N is connected to the output of the isolator 35N.

The duplexer 13W has a common terminal, a reception terminal (the one indicated with R) and a transmission terminal (the one indicated with T). The common terminal of the duplexer 13W is connected to the one of the fixed contacts of the high frequency switch 16. The reception terminal of the duplexer 13W is connected to the input of the low-noise amplifier 36W. The transmission terminal of the duplexer 13W is connected to the output of the isolator 35W.

The diplexer 11 separates N-CDMA signals and GSM signals from W-CDMA signals and DCS signals, according to the frequency of the signals. To be specific, the diplexer 11 outputs from the first port the N-CDMA transmission signals or the GSM transmission signals inputted to the second port and the W-CDMA transmission signals or the DCS transmission signals inputted to the third port. The diplexer 11 outputs from the second port the N-CDMA reception signals or the GSM reception signals inputted to the first port, and outputs from the third port the W-CDMA reception signals or the DCS reception signals inputted to the first port.

The high frequency switch 17 separates N-CDMA transmission signals and N-CDMA reception signals from GSM transmission signals and GSM reception signals. To be specific, the high frequency switch 17 outputs from the movable contact the N-CDMA transmission signals inputted to one of the fixed contacts, and outputs from the one of the fixed contacts the N-CDMA reception signals inputted to the movable contact. The high frequency switch 17 outputs from the movable contact the GSM transmission signals inputted to the other one of the fixed contacts, and outputs from the other one of the fixed contacts the GSM reception signals inputted to the movable contact.

The high frequency switch 16 separates W-CDMA transmission signals and W-CDMA reception signals from DCS transmission signals and DCS reception signals. To be specific, the high frequency switch 16 outputs from the movable contact the W-CDMA transmission signals inputted to one of the fixed contacts, and outputs from the one of the fixed contacts the W-CDMA reception signals inputted to the movable contact. The high frequency switch 16 outputs from the movable contact the DCS transmission signals inputted to the other one of the fixed contacts, and outputs from the other one of the fixed contacts the DCS reception signals inputted to the movable contact.

The high frequency switch 12G separates GSM transmission signals and GSM reception signals from each other. To be specific, the high frequency switch 12G outputs from one of the fixed contacts the GSM reception signals (indicated as GSM/RX in the drawings) inputted to the movable contact, and outputs from the movable contact the GSM transmission signals (indicated as GSM/TX in the drawings) inputted to the other one of the fixed contacts.

The high frequency switch 12D separates DCS transmission signals and DCS reception signals from each other. To be specific, the high frequency switch 12D outputs from one of the fixed contacts the DCS reception signals (indicated as DCS/RX in the drawings) inputted to the movable contact, and outputs from the movable contact the DCS transmission signals (indicated as DCS/TX in the drawings) inputted to the other one of the fixed contacts.

The duplexer 13W separates W-CDMA transmission signals and W-CDMA reception signals from each other, according to the difference in frequency. To be specific, the duplexer 13W outputs from the reception terminal the W-CDMA reception signals (indicated as WCDMA/RX in the drawings) inputted to the common terminal, and outputs from the common terminal the W-CDMA transmission signals (indicated as WCDMA/TX in the drawings) inputted to the transmission terminal.

The duplexer 13N separates N-CDMA transmission signals and N-CDMA reception signals from each other, according to the difference in frequency. To be specific, the duplexer 13N outputs from the reception terminal the N-CDMA reception signals (indicated as NCDMA/RX in the drawings) inputted to the common terminal, and outputs from the common terminal the N-CDMA transmission signals (indicated as NCDMA/TX in the drawings) inputted to the transmission terminal.

The integrated circuit 3 will now be described. The integrated circuit 3 receives an input signal of the baseband made up of an I signal and a Q signal, and outputs an output signal of the baseband made up of an I signal and a Q signal.

The integrated circuit 3 comprises: a mixer 42G having an input connected to the output of the BPF 25G; an amplifier 43G having an input connected to an output of the mixer 42G; a mixer 42D having an input connected to the output of the BPF 25D; and an amplifier 43D having an input connected to an output of the mixer 42D. The integrated circuit 3 further comprises: a mixer 42W having an input connected to the output of the BPF 37W; an amplifier 43W having an input connected to an output of the mixer 42W; a mixer 42N having an input connected to the output of the BPF 37N; and an amplifer 43N having an input connected to an output of the mixer 42N.

The integrated circuit 3 further comprises: a mixer 41 having an output connected to the input of each of the power amplifiers 21G and 21D; a mixer 41W having an output connected to the input of the BPF 31W; and a mixer 41N having an output connected to the input of the BPF 31N. The mixers 42G and 42D are connected to the voltage controlled oscillator 5. The mixer 42W is connected to the voltage controlled oscillator 6W. The mixer 41 is connected to the voltage controlled oscillator 4. The mixer 41W is connected to the voltage controlled oscillator 6W. The mixer 41N is connected to the voltage controlled oscillator 6N.

The integrated circuit 3 further comprises a phase-locked loop circuit (indicated as GSM/DCS PLL in the drawings) 44 for the GSM and the DCS, a phase-locked loop circuit (indicated as W-CDMA PLL in the drawings) 45W for the W-CDMA, and a phase-locked loop circuit (indicated as N-CDMA PLL in the drawings) 45N for the N-CDMA. The phase-locked loop circuit 44 is connected to the voltage controlled oscillators 4 and 5. The phase-locked loop circuit 45W is connected to the voltage controlled oscillator 6W. The phase-locked loop circuit 45N is connected to the voltage controlled oscillator 6N.

The mixer 42G mixes an output signal of the BPF 25G with a high frequency signal outputted from the voltage controlled oscillator 5, and thereby converts the high-frequency reception signal to a baseband signal. The mixer 42D mixes an output signal of the BPF 25D with a high frequency signal outputted from the voltage controlled oscillator 5, and thereby converts the high-frequency reception signal to a baseband signal. The mixer 42W mixes an output signal of the BPF 37W with a high frequency signal outputted from the voltage controlled oscillator 6W, and thereby converts the high-frequency reception signal to a baseband signal. The mixer 42N mixes an output signal of the BPF 37N with a high frequency signal outputted from the voltage controlled oscillator 6N, and thereby converts the high-frequency reception signal to a baseband signal.

The mixer 41 mixes a baseband signal inputted to the integrated circuit 3 with a high frequency signal outputted from the voltage controlled oscillator 4, and thereby converts the baseband signal to a high-frequency transmission signal. The mixer 41W mixes a baseband signal inputted to the integrated circuit 3 with a high frequency signal outputted from the voltage controlled oscillator 6W, and thereby converts the baseband signal to a high-frequency transmission signal. The mixer 41N mixes a baseband signal inputted to the integrated circuit 3 with a high frequency signal outputted from the voltage controlled oscillator 6N, and thereby converts the baseband signal to a high-frequency transmission signal.

Although not shown, the integrated circuit 3 further comprises: a function of quadrature-modulating the received I signal and Q signal and sending the modulated signal to the mixers 41, 41W and 41N; and a function of generating an I signal and a Q signal by quadrature-demodulating the output signals of the amplifiers 43G, 43D, 43W and 43N, and outputting the I signal and Q signal. It is possible that the mixers 41, 41W and 41N also have a function of quadrature modulation or the mixers 42G, 42D, 42W and 42N also have a function of quadrature demodulation.

A GSM reception signal outputted from the high frequency switch 12G passes through the BPF 25G and is inputted to the mixer 42G. A DCS reception signal outputted from the high frequency switch 12D passes through the BPF 25D and is inputted to the mixer 42D. A W-CDMA reception signal outputted from the duplexer 13W passes through the low-noise amplifier 36W and the BPF 37W and is inputted to the mixer 42W. An N-CDMA reception signal outputted from the duplexer 13N passes through the low-noise amplifier 36N and the BPF 37N and is inputted to the mixer 42N.

An output signal of the mixer 41 passes through the power amplifier 21G, the coupler 22G and the LPF 24G and is inputted to the high frequency switch 12G. In addition, an output signal of the mixer 41 passes through the power amplifier 21D, the coupler 22D and the LPF 24D and is inputted to the high frequency switch 12D. An output signal of the mixer 41W passes through the BPF 31W, the power amplifier 32W, the coupler 33W and the isolator 35W and is inputted to the duplexer 13W. An output signal of the mixer 41N passes through the BPF 31N, the power amplifier 32N, the coupler 33N and the isolator 35N and is inputted to the duplexer 13N.

Figure 2:
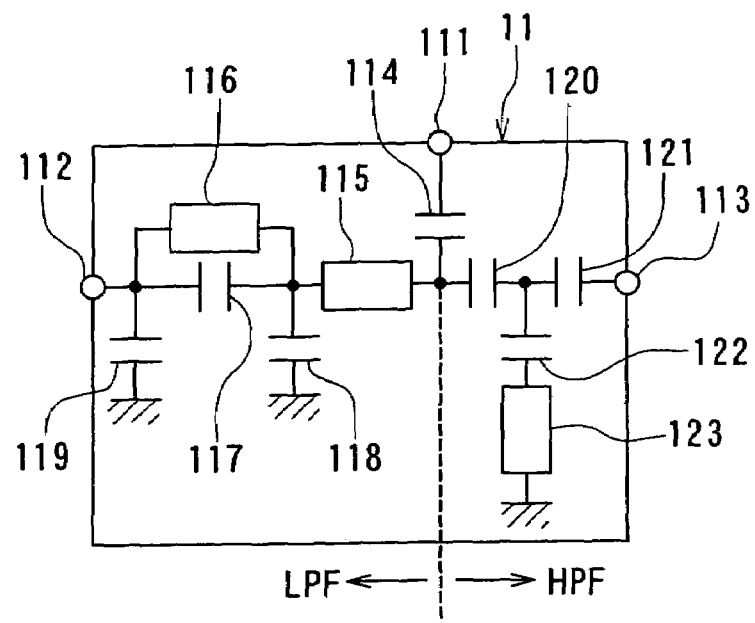
FIG. 2 is a schematic diagram illustrating an example of the circuit configuration of the diplexer of FIG. 1.

Reference is now made to FIG. 2 to describe an example of the circuit configuration of the diplexer 11. The diplexer 11 of FIG. 2 has first to third ports 111, 112 and 113. The first port 111 is connected to the antenna 1. The second port 112 is designed to receive and output GSM signals and N-CDMA signals. The third port 113 is designed to receive and output DCS signals and W-CDMA signals. The diplexer 11 further has: a capacitor 114 having an end connected to the first port 111; an inductor 115 having an end connected to the other end of the capacitor 114; an inductor 116 having an end connected to the other end of the inductor 115 and the other end connected to the second port 112; a capacitor 117 having an end connected to the other end of the inductor 115 and the other end connected to the second port 112; a capacitor 118 having an end connected to the other end of the inductor 115 and the other end grounded; and a capacitor 119 having an end connected to the second port 112 and the other end grounded. The inductors 115 and 116 and the capacitors 117, 118 and 119 constitute an LPF for allowing transmission signals and reception signals of the GSM and the N-CDMA to pass therethrough.

The diplexer 11 further has: a capacitor 120 having an end connected to the other end of the capacitor 114; a capacitor 121 having an end connected to the other end of the capacitor 120 and the other end connected to the third port 113; a capacitor 122 having an end connected to the other end of the capacitor 120; and an inductor 123 having an end connected to the other end of the capacitor 122 and the other end grounded. The capacitors 120, 121 and 122 and the inductor 123 constitute a high-pass filter (hereinafter called an HPF) for allowing transmission signals and reception signals of the DCS and the W-CDMA to pass therethrough.

Figure 3:
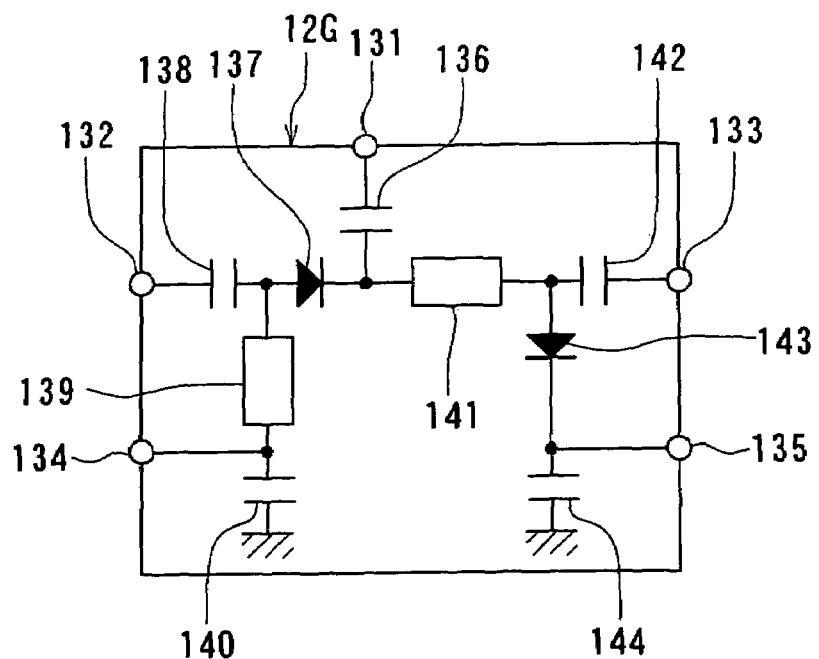
FIG. 3 is a schematic diagram illustrating an example of the circuit configuration of the high frequency switch of FIG. 1.

Reference is now made to FIG. 3 to describe an example of the circuit configuration of the high frequency switch 12G. The high frequency switch 12G of FIG. 3 has the movable contact 131, the two fixed contacts 132 and 133, and two control terminals 134 and 135. The fixed contact 132 is the one indicated with T in FIG. 1. The fixed contact 133 is the one indicated with R in FIG. 1. The high frequency switch 12G further has: a capacitor 136 having an end connected to the movable contact 131; a diode 137 having a cathode connected to the other end of the capacitor 136; a capacitor 138 having an end connected to the anode of the diode 137 and the other end connected to the fixed contact 132; an inductor 139 having an end connected to the anode of the diode 137 and the other end connected to the control terminal 134; and a capacitor 140 having an end connected to the control terminal 134 and the other end grounded.

The high frequency switch 12G further has: an inductor 141 having an end connected to the other end of the capacitor 136; a capacitor 142 having an end connected to the other end of the inductor 141 and the other end connected to the fixed contact 133; a diode 143 having an anode connected to the other end of the inductor 141 and a cathode connected to the control terminal 135; and a capacitor 144 having an end connected to the control terminal 135 and the other end grounded.

In the high frequency switch 12G, when the control signal applied to the control terminal 134 is high and the control signal applied to the control terminal 135 is low, the two diodes 137 and 143 both turn on and the fixed contact 132 is connected to the movable contact 131. When the control signal applied to the control terminal 134 is low and the control signal applied to the control terminal 135 is high, the two diodes 137 and 143 both turn off and the fixed contact 133 is connected to the movable contact 131.

Each of the high frequency switches 12D, 16 and 17 of FIG. 1 has a configuration the same as that of the high frequency switch 12G.

Figure 4:
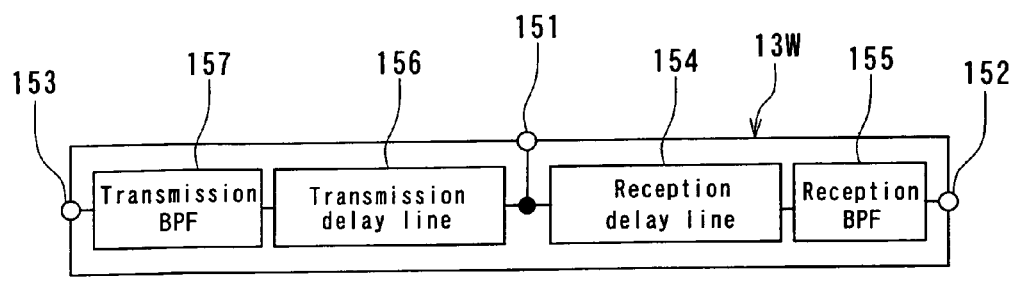
FIG. 4 is a block diagram illustrating an example of the circuit configuration of the duplexer of FIG. 1.

Reference is now made to FIG. 4 to describe an example of the circuit configuration of the duplexer 13W. The duplexer 13W of FIG. 4 has a common terminal 151, a reception terminal 152 and a transmission terminal 153. The duplexer 13W further has: a reception-side delay line 154 having an end connected to the common terminal 151; and a reception-side BPF 155 having an input connected to the other end of the delay line 154 and an output connected to the reception terminal 152. The duplexer 13W further has: a transmission-side delay line 156 having an end connected to the common terminal 151; and a transmission-side BPF 157 having an output connected to the other end of the delay line 156 and an input connected to the transmission terminal 153. Each of the BPFs 155 and 157 is made up of an acoustic wave element.

The reception-side delay line 154 is inserted between the common terminal 151 and the reception-side BPF 155, so that the impedance is nearly 50 ohms in the frequency band of the reception signal and the impedance is sufficiently high in the frequency band of the transmission signal when the duplexer 13W is seen from the reception terminal 152. Similarly, the transmission-side delay line 156 is inserted between the common terminal 151 and the transmission-side BPF 157, so that the impedance is nearly 50 ohms in the frequency band of the transmission signal and the impedance is sufficiently high in the frequency band of the reception signal when the duplexer 13W is seen from the transmission terminal 153. Depending on the configurations of the BPFs 155 and 157, one of the reception-side delay line 154 and the transmission-side delay line 156 may be only provided in some cases.

Figure 5:
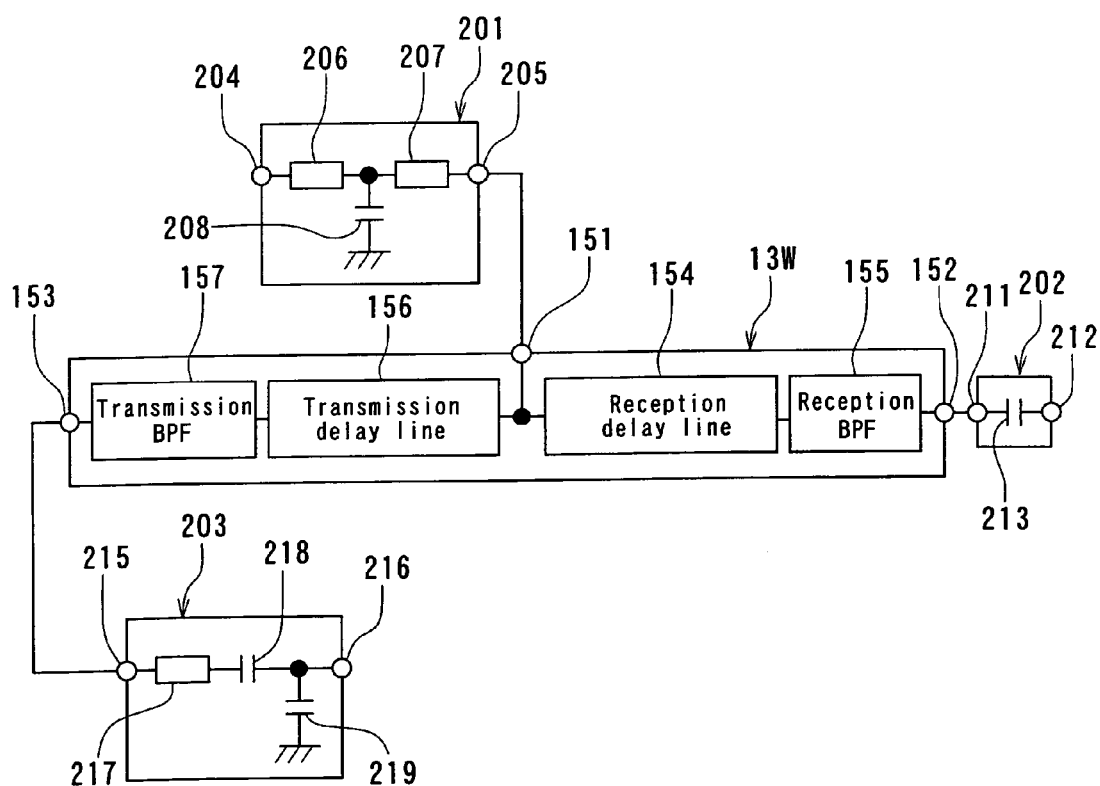
FIG. 5 is a schematic diagram illustrating an example of the circuit configuration of the duplexer of FIG. 1 and a matching circuit connected thereto.

Alternatively, a matching circuit for performing impedance matching between the duplexer 13W and an external circuit may be provided between each of the common terminal 151, the reception terminal 152 and the transmission terminal 153 of the duplexer 13W of FIG. 4 and the external circuit connected thereto. FIG. 5 is a schematic diagram illustrating an example of the circuit configuration of the duplexer 13W and the matching circuits connected thereto. The duplexer 13W of the example shown in FIG. 5 has a configuration the same as that of the duplexer 13W of FIG. 4. In the example shown in FIG. 5 the matching circuit 201 is connected to the common terminal 151, the matching circuit 202 is connected to the reception terminal 152, and the matching circuit 203 is connected to the transmission terminal 153. The matching circuits 201, 202 and 203 are included in the front end module 2.

The matching circuit 201 has: two terminals 204 and 205; an inductor 206 having an end connected to the terminal 204; an inductor 207 having an end connected to the other end of the inductor 206 and the other end connected to the terminal 205; and a capacitor 208 having an end connected to the other end of the inductor 206 and the other end grounded. The terminal 204 is connected to one of the fixed contacts of the high frequency switch 16. The terminal 205 is connected to the common terminal 151 of the duplexer 13W.

The matching circuit 202 has two terminals 211 and 212 and a capacitor 213 connected between the terminals 211 and 212. The terminal 211 is connected to the reception terminal 152 of the duplexer 13W. The terminal 212 is connected to the input of the low-noise amplifier 36W of FIG. 1.

The matching circuit 203 has: two terminals 215 and 216; an inductor 217 having an end connected to the terminal 215; a capacitor 218 having an end connected to the other end of the inductor 217 and the other end connected to the terminal 216; and a capacitor 219 having an end connected to the other end of the capacitor 218 and the other end grounded. The terminal 215 is connected to the transmission terminal 153 of the duplexer 13W. The terminal 216 is connected to the output of the isolator 35W of FIG. 1.

The duplexer 13N of FIG. 1 and the matching circuit connected thereto has a circuit configuration the same as that of the duplexer 13W and the matching circuit connected thereto.

Figure 6:
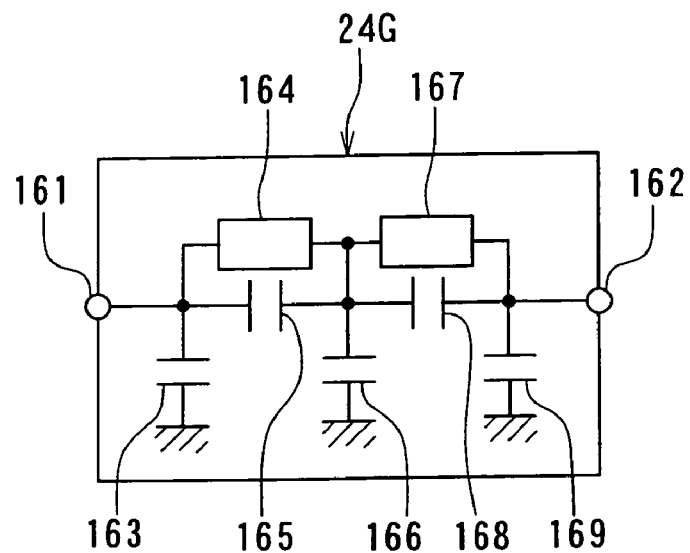
FIG. 6 is a schematic diagram illustrating an example of the circuit configuration of the low-pass filter of FIG. 1.

Reference is now made to FIG. 6 to describe an example of the circuit configuration of the LPF 24G. The LPF 24G of FIG. 6 has an input terminal 161 and an output terminal 162. The LPF 24G further has: a capacitor 163 having an end connected to the input terminal 161 and the other end grounded; an inductor 164 having an end connected to the input terminal 161; a capacitor 165 having an end connected to the input terminal 161 and the other end connected to the other end of the inductor 164; and a capacitor 166 having an end connected to the other end of the inductor 164 and the other end grounded. The LPF 24G further has: an inductor 167 having an end connected to the other end of the inductor 164 and the other end connected to the output terminal 162; a capacitor 168 having an end connected to the other end of the inductor 164 and the other end connected to the output terminal 162; and a capacitor 169 having an end connected to the output terminal 162 and the other end grounded. The LPF 24D of FIG. 1 has a circuit configuration the same as that of the LPF 24G.

Figure 7:
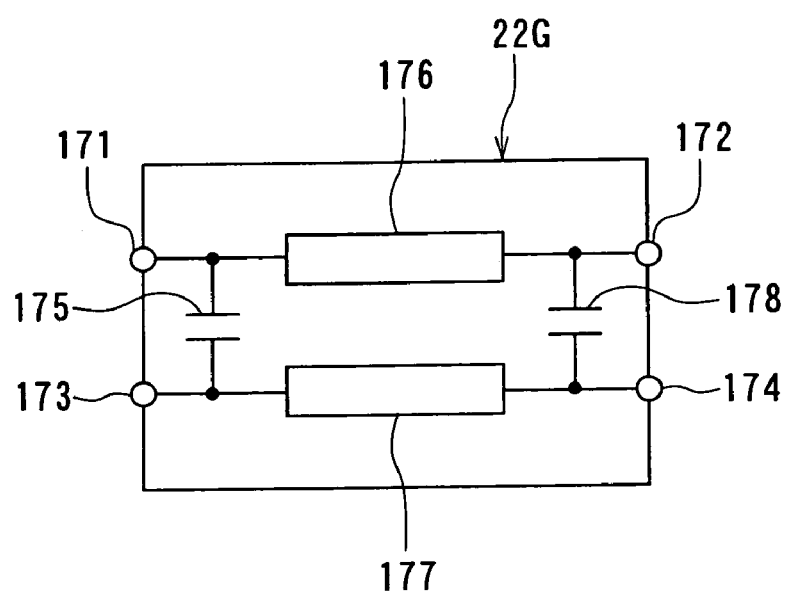
FIG. 7 is a schematic diagram illustrating an example of the circuit configuration of the coupler of FIG. 1.

Reference is now made to FIG. 7 to describe an example of the circuit configuration of the coupler 22G. The coupler 22G of FIG. 7 has an input terminal 171, an output terminal 172, a monitor terminal 173 and a load connecting terminal 174. The coupler 22G further has: a capacitor 175 having an end connected to the input terminal 171 and the other end connected to the monitor terminal 173; an inductor 176 having an end connected to the input terminal 171 and the other end connected to the output terminal 172; an inductor 177 having an end connected to the monitor terminal 173 and the other end connected to the load connecting terminal 174; and a capacitor 178 having an end connected to the output terminal 172 and the other end connected to the load connecting terminal 174. The monitor terminal 173 is connected to the input of the automatic power control circuit 23G. The load connecting terminal 174 is grounded through a load of 50 ohms. Each of the couplers 22D, 33W and 33N has a circuit configuration the same as that of the coupler 22G.

Figure 8:
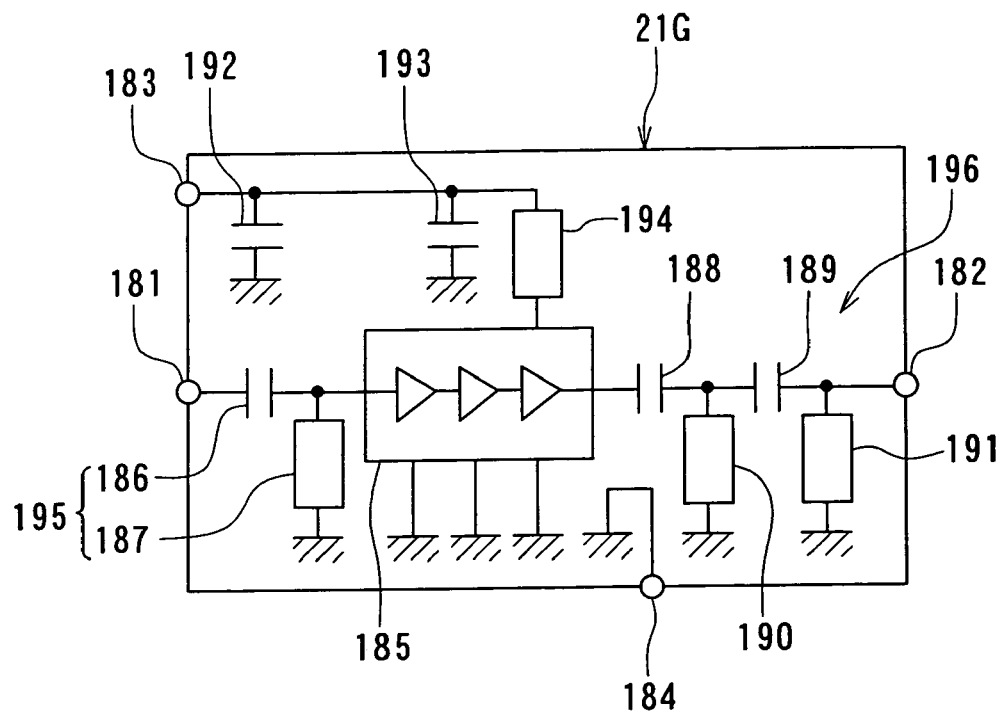
FIG. 8 is a schematic diagram illustrating an example of the circuit configuration of the power amplifier of FIG. 1.

Reference is now made to FIG. 8 to describe an example of the circuit configuration of the power amplifier 21G. The power amplifier 21G of FIG. 8 has an input terminal 181, an output terminal 182, a power terminal 183 and a ground terminal 184. A supply voltage is applied to the power terminal 183.

The power amplifier 21G further has a monolithic microwave integrated circuit (hereinafter referred to as MMIC) 185 that functions as an amplifier. The MMIC 185 has a ground end connected to the ground terminal 184. The power amplifier 21G further has: a capacitor 186 having an end connected to the input terminal 181 and the other end connected to an input of the MMIC 185; and an inductor 187 having an end connected to the other end of the capacitor 186 and the other end connected to the ground terminal 184. The capacitor 186 and the inductor 187 constitute an input matching circuit 195.

The power amplifier 21G further has: a capacitor 188 having an end connected to an output of the MMIC 185; a capacitor 189 having an end connected to the other end of the capacitor 188 and the other end connected to the output terminal 182; an inductor 190 having an end connected to the other end of the capacitor 188 and the other end connected to the ground terminal 184; and an inductor 191 having an end connected to the output terminal 182 and the other end connected to the ground terminal 184. The capacitors 188 and 189 and the inductors 190 and 191 constitute an output matching circuit 196.

The power amplifier 21G further has: capacitors 192 and 193 each having an end connected to the power terminal 183 and the other end connected to the ground terminal 184; and a choke coil 194 having an end connected to the power terminal 183 and the other end connected to the power input of the MMIC 185. Each of the power amplifiers 21D, 32W and 32N of FIG. 1 has a circuit configuration the same as that of the power amplifier 21G.

The structure of the front end module 2 will now be described. The front end module 2 comprises a single multi-layer substrate for integration of the diplexer 11, the high frequency switches 16, 17, 12G and 12D, and the duplexers 13W and 13N. The multi-layer substrate has a structure in which dielectric layers and patterned conductor layers are alternately stacked. The circuit of the front end module 2 is made up of the conductor layers located inside or on the surface of the multi-layer substrate, and elements mounted on the substrate. In particular, the diplexer 11 is made up of the conductor layer located inside or on the surface of the multi-layer substrate.

Figure 9:
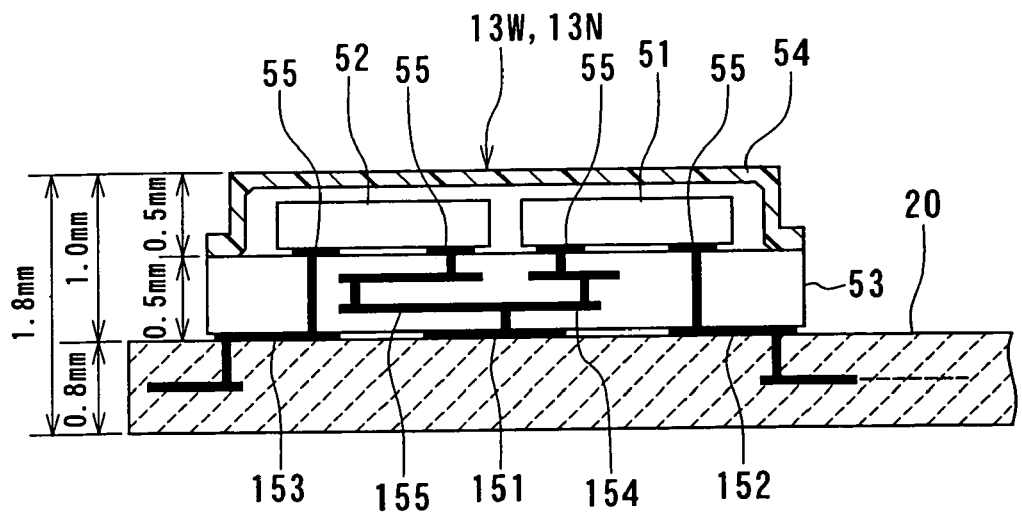
FIG. 9 is a cross-sectional view illustrating a first example of the structure of the duplexer of FIG. 1.
Figure 10:
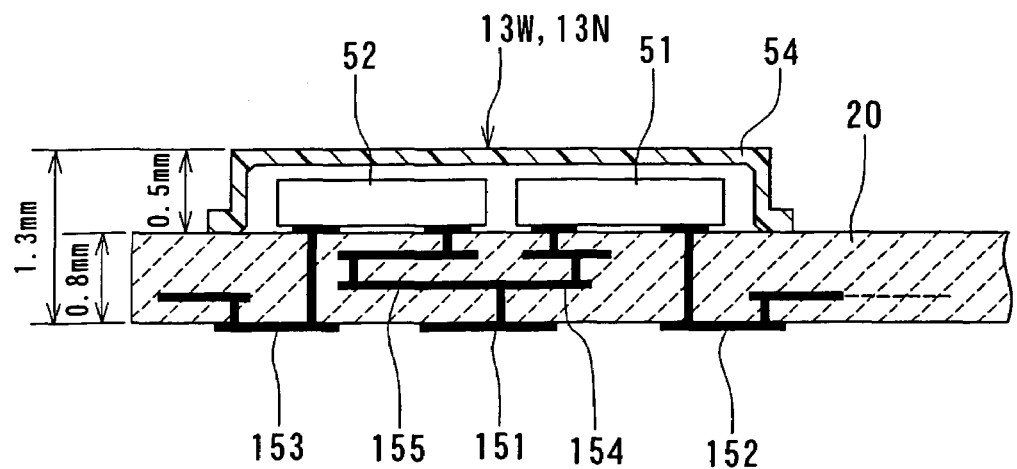
FIG. 10 is a cross-sectional view illustrating a second example of the structure of the duplexer of FIG. 1.
Figure 11:
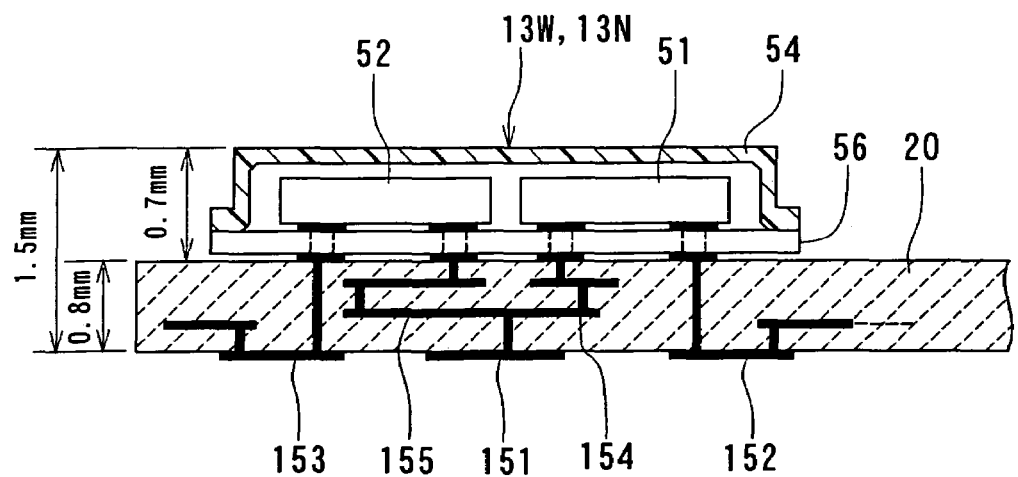
FIG. 11 is a cross-sectional view illustrating a third example of the structure of the duplexer of FIG. 1.

Reference is now made to FIG. 9 to FIG. 11 to describe three examples of the structures of the duplexers 13W and 13N one by one. Although surface acoustic wave elements are employed as acoustic wave elements in the examples herein described, it is possible to use bulk acoustic wave elements in place of the surface acoustic wave elements. While the surface acoustic wave elements utilize acoustic waves (surface acoustic waves) that propagate across the surface of a piezoelectric material, the bulk acoustic wave elements utilize acoustic waves (bulk acoustic waves) that propagate inside a piezoelectric material. Some of the bulk acoustic wave elements made of piezoelectric thin films in particular are called thin-film bulk acoustic wave elements. Resonators made of piezoelectric thin films in particular are called film bulk acoustic resonators (FBAR). The above-mentioned thin-film bulk acoustic wave elements may be used as the above-mentioned acoustic wave elements. The thin-film bulk acoustic wave elements have a temperature characteristic better than the surface acoustic wave elements. Typically, the thin-film bulk acoustic wave elements have a temperature characteristic of around 20 ppm/° C. while the surface acoustic wave elements have a temperature characteristic of around 40 ppm/° C. Therefore, the thin-film bulk acoustic wave elements are suitable for achieving a steep frequency characteristic required for the filters.

FIG. 9 is a cross-sectional view for illustrating the first example of the structure of the duplexer 13W or 13N. In the first example the duplexer 13W or 13N has: a chip 51 including a surface acoustic wave element used in the reception-side BPF 155 of FIG. 4; a chip 52 including a surface acoustic wave element used in the transmission-side BPF 157 of FIG. 4; a mounting board 53 on which the two chips 51 and 52 are mounted; and a cap 54 for sealing the chips 51 and 52. The mounting board 53 may be a multi-layer ceramic substrate in which the dielectric layers are made of ceramic, for example. The mounting board 53 includes the components that make up the duplexer 13W or 13N except the surface acoustic wave elements. For example, the reception-side delay line 154 and the transmission-side delay line 156 of the duplexer 13W or 13N are made of the conductor layers located inside or on the surface of the mounting board 53. The common terminal 151, the reception terminal 152 and the transmission terminal 153 of the duplexer 13W or 13N are disposed on the bottom surface of the mounting board 53.

Each of the chips 51 and 52 has: a piezoelectric substrate made of a piezoelectric material such as $LiTaO_3$; an inter-digital electrode formed on one of the surfaces of the piezoelectric substrate; and a connecting electrode 55 for connecting the inter-digital electrode to an external circuit. In the example shown in FIG. 9 the connecting electrode 55 is disposed in the same plane as the inter-digital electrode. In the example the chips 51 and 52 are mounted on the mounting board 53 by flip-chip bonding so that the inter-digital electrode faces toward the top surface of the mounting board 53. When the chips 51 and 52 are mounted on the mounting board 53, a space is created between the inter-digital electrode and the top surface of the mounting board 53.

In the first example the duplexers 13W and 13N having the above-described configuration are mounted on the multi-layer substrate 20 of the front end module 2. The multi-layer substrate 20 may be a multi-layer low-temperature co-fired ceramic substrate, for example. The multi-layer substrate 20 includes the circuits of the front end module 2 except the duplexers 13W and 13N.

FIG. 9 shows an example of the thickness of the front end module 2 of the first example. In this example the mounting board 53 of the duplexer 13W or 13N has a thickness of 0.5 millimeter (mm), a portion of the duplexer 13W or 13N from the top surface of the mounting board 53 to the top surface of the cap 54 has a thickness of 0.5 mm, and the multi-layer substrate 20 has a thickness of 0.8 mm. Therefore, the front end module 2 of this example has a thickness of 1.8 mm or greater.

FIG. 10 is a cross-sectional view for illustrating the second example of the structures of the duplexers 13W and 13N. In the second example the duplexer 13W or 13N has the chips 51 and 52 the same as those of the first example. However, the mounting board 53 is not provided in the second example but the chips 51 and 52 are mounted directly on the multi-layer substrate 20 of the front end module 2. The chips 51 and 52 may be mounted on the multi-layer substrate 20 by flip-chip bonding so that the inter-digital electrode faces toward the top surface of the multi-layer substrate 20. When the chips 51 and 52 are mounted on the multi-layer substrate 20, a space is created between the inter-digital electrode and the top surface of the multi-layer substrate 20. The chips 51 and 52 are sealed by the cap 54.

In the second example the multi-layer substrate 20 includes the components of the duplexers 13W and 13N except the surface acoustic wave elements. For example, the reception-side delay line 154 and the transmission-side delay line 156 of each of the duplexer 13W and 13N are made of the conductor layers located inside or on the surface of the multi-layer substrate 20. The common terminal 151, the reception terminal 152 and the transmission terminal 153 of each of the duplexers 13W and 13N are disposed on the bottom surface of the multi-layer substrate 20. The multi-layer substrate 20 includes the circuits of the front end module 2 except the duplexers 13W and 13N.

FIG. 10 shows an example of the thickness of the front end module 2 of the second example. In this example a portion of the duplexer 13W or 13N from the top surface of the multi-layer substrate 20 to the top surface of the cap 54 has a thickness of 0.5 mm, and the multi-layer substrate 20 has a thickness of 0.8 mm. Therefore, the front end module 2 of this example has a thickness of 1.3 mm or greater.

FIG. 11 is a cross-sectional view for illustrating the third example of the structures of the duplexers 13W and 13N. In the third example the duplexer 13W or 13N has: the chips 51 and 52 the same as those of the first example; a mounting board 56 or two mounting boards 56 on which the chips 51 and 52 are mounted; and the cap 54 for sealing the chips 51 and 52. Although the two chips 51 and 52 are mounted on the single mounting board 56 in the example shown in FIG. 11, it is possible that the chips 51 and 52 are mounted on the respective mounting boards 56.

The mounting board 56 has a single-layer dielectric layer, patterned conductor layers provided on the top and bottom surfaces of the dielectric layer, and a conductor portion provided on the side surfaces of the dielectric layer and connecting the conductor layer provided on the top surface of the dielectric layer to the conductor layer provided on the bottom surface of the dielectric layer. The chips 51 and 52 may be mounted on the mounting board 56 by flip-chip bonding so that the inter-digital electrode faces toward the top surface of the mounting board 56, for example. When the chips 51 and 52 are mounted on the mounting board 56, a space is created between the inter-digital electrode and the top surface of the mounting board 56.

The chips 51 and 52 and the mounting board 56 are mounted on the multi-layer substrate 20 of the front end module 2. In the third example the multi-layer substrate 20 includes the components of the duplexers 13W and 13N except the surface acoustic wave elements. For example, the reception-side delay line 154 and the transmission-side delay line 156 of each of the duplexers 13W and 13N are made of the conductor layers located inside or on the surface of the multi-layer substrate 20. The common terminal 151, the reception terminal 152 and the transmission terminal 153 of each of the duplexers 13W and 13N are disposed on the bottom surface of the multi-layer substrate 20. The multi-layer substrate 20 includes the circuits of the front end module 2 except the duplexers 13W and 13N.

FIG. 11 shows an example of the thickness of the front end module 2 of the third example. In this example a portion of the duplexer 13W or 13N from the top surface of the multi-layer substrate 20 to the top surface of the cap 54 has a thickness of 0.7 mm, and the multi-layer substrate 20 has a thickness of 0.8 mm. Therefore, the front end module 2 of this example has a thickness of 1.5 mm or greater.

According to the front end module 2 of the embodiment as thus described, the diplexer 11, the high frequency switches 16, 17, 12G and 12D, the duplexer 13W including the two acoustic wave elements, and the duplexer 13N including the two acoustic wave elements are integrated on the single multi-layer substrate 20. The diplexer 11 is made up of the conductor layer located inside or on the surface of the multi-layer substrate 20. Each of the duplexers 13W and 13N including the acoustic wave elements is smaller in size and weight and easier to achieve combination and integration, compared to the coaxial dielectric type duplexer. As a result, according to the embodiment, it is possible to implement the front end module 2 that is operable in two types of time division multiple access systems (the GSM and the DCS) and two types of code division multiple access systems (the W-CDMA and the N-CDMA) and easily achieves a reduction in size and weight, and combination and integration of components.

According to the embodiment, the duplexers 13W and 13N including the acoustic wave elements are integrated with the diplexer 11 and the high frequency switches 12G, 12D, 16 and 17, so that the impedance matching between each of the duplexers 13W and 13N and the periphery circuits is optimized. As a result, an improvement in performance of the front end module 2 is achieved, too.

For each of the duplexers 13W and 13N the impedance of each of the common terminal 151, the reception terminal 152 and the transmission terminal 153 is set to 50 ohms for the frequencies in the pass band so that the insertion loss is minimized, and set to such a value for the frequencies in the rejection band that the attenuation is increased. Therefore, it is required to optimize the characteristic of each of the duplexers 13W and 13N as a whole including the acoustic wave elements and the components (the delay lines 154 and 156 and the matching circuits) besides the acoustic wave elements.

In the first example of the structure of the duplexer 13W or 13N shown in FIG. 9, the chips 51 and 52 each including the acoustic wave elements and the mounting board 53 including the components of the duplexer 13W or 13N except the acoustic wave elements are integrated. As a result, according to the first example, it is possible to manufacture the duplexers 13W and 13N independently from the other components of the front end module 2. It is thereby possible to mount the duplexers 13W and 13N each having an optimized characteristic on the multi-layer substrate 20. However, the first example has a problem that the thickness of the front end module 2 is increased.

In the second example of the structure of the duplexer 13W or 13N shown in FIG. 10, the components of the duplexer 13W or 13N except the acoustic wave elements are provided in the multi-layer substrate 20, and the chips 51 and 52 each including the acoustic wave element are mounted on the multi-layer substrate 20. According to the second example, it is possible to reduce the thickness of the front end module 2. In addition, according to the second example, it is possible that the characteristics of the chips 51 and 52 and the characteristics of the components of the duplexer 13W or 13N except the acoustic wave elements provided in the multi-layer substrate 20 are designed so as to optimize the characteristic of the duplexer 13W or 13N as a whole. Through the use of the chips 51 and 52 and the multi-layer substrate 20 having the characteristics as designed, the characteristic of the duplexer 13W or 13N as a whole is optimized.

It is required to use a probe to measure the characteristics of the chips 51 and 52 as bare chips. However, it is difficult to measure the high frequency characteristics of the chips 51 and 52 with accuracy since the probe itself has a high frequency characteristic. As a result, there arises a problem that some percent of the chips 51 and 52 mounted on the multi-layer substrates 20 are nonconforming ones. If the nonconforming chips 51 and 52 are mounted on the multi-layer substrate 20, the entire front end module 2 is nonconforming even though the components of the front end module 2 except the duplexers 13W and 13N have good characteristics. Therefore, the second example has a problem that the yield of the front end module 2 is reduced.

In the third example of the structure of the duplexer 13W or 13N shown in FIG. 11, the chips 51 and 52 each including the acoustic wave element are mounted on the mounting board 56. Therefore, the chips 51 and 52 and the mounting board 56 make up a single packaged component. According to the third example, the components of each of the duplexers 13W and 13N except the acoustic wave elements are provided in the multi-layer substrate 20, and the chips 51 and 52 and the mounting board 56 are mounted on the multi-layer substrate 20. It is possible to measure the characteristic of the component made up of the chips 51 and 52 and the mounting board 56 with accuracy by using a jig for measuring ordinary components without using a probe. Consequently, according to the third example, it is possible to mount only conforming ones of the chips 51 and 52 and the mounting boards 56 on the multi-layer substrate 20. As a result, the yield of the front end module 2 is improved. According to the third example, it is possible to reduce the thickness of the front end module 2, too, since it is acceptable that the mounting board 56 is thin.

In the above-described second and third examples the chips 51 and 52 including the surface acoustic wave elements used in the BPFs of the duplexers 13W and 13N are mounted on the top surface of the multi-layer substrate 20. In addition, at least part of the circuit portions of the duplexers 13W and 13N except the surface acoustic wave elements is made up of the conductor layers located inside or on the surface of the multi-layer substrate 20. As a result, a further reduction in size and weight of the front end module 2 is achieved.

Three modification examples of the front end module 2 of the embodiment will now be described.

Figure 12:
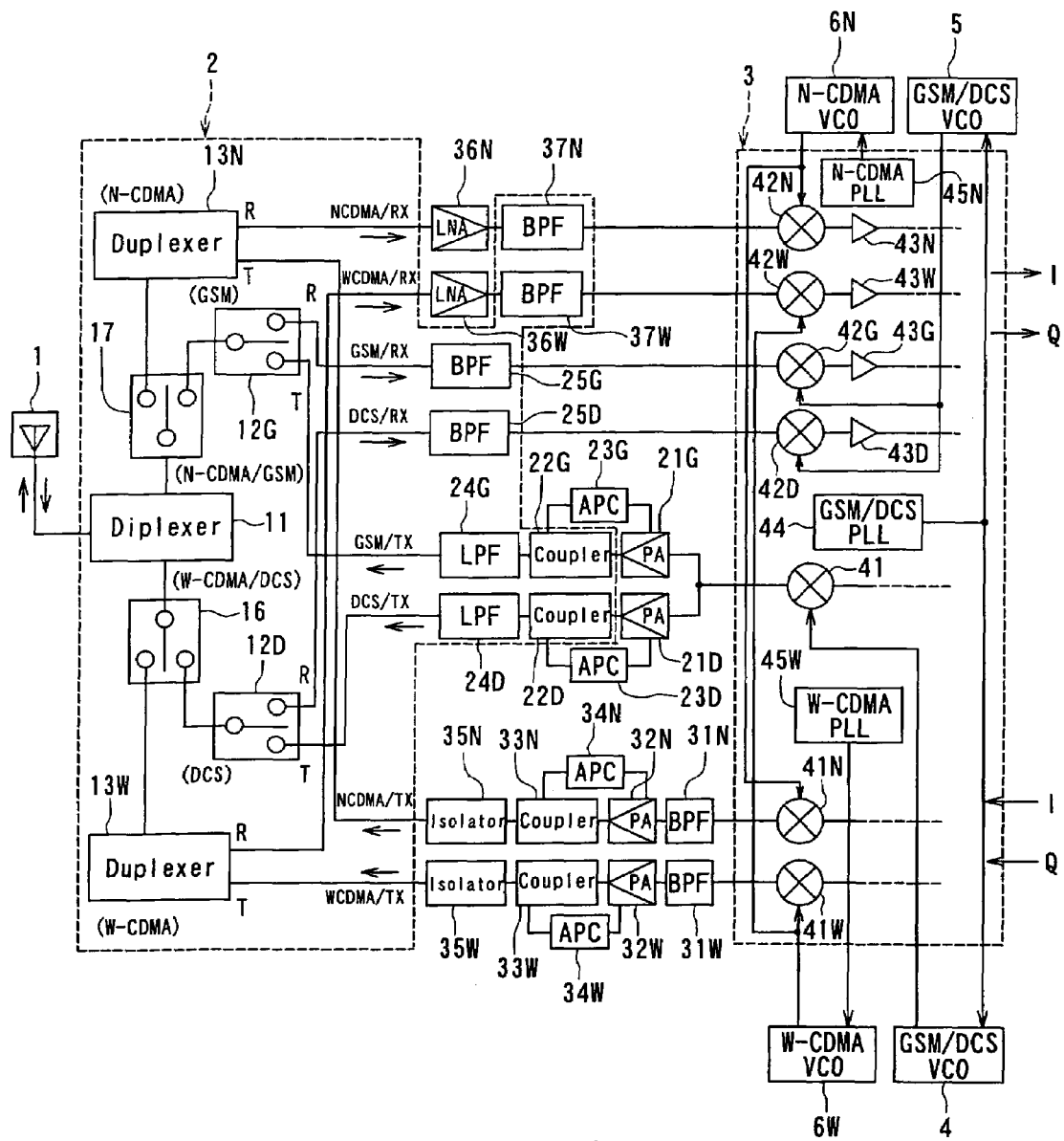
FIG. 12 is a block diagram illustrating a high frequency circuit of a cellular phone including a front end module of a first modification example of the first embodiment of the invention.

FIG. 12 is a block diagram illustrating a high frequency circuit of a cellular phone including the front end module 2 of the first modification example. In addition to the components of the front end module 2 shown in FIG. 1, the front end module 2 of the first modification example comprises: the coupler 22G and the LPF 24G for allowing GSM transmission signals to pass therethrough; the coupler 22D and the LPF 24D for allowing DCS transmission signals to pass therethrough; the BPF 25G for allowing GSM reception signals to pass therethrough; the BPF 25D for allowing DCS reception signals to pass therethrough; the BPF 37W for allowing W-CDMA reception signals to pass therethrough; and the BPF 37N for allowing N-CDMA reception signals to pass therethrough. In the first modification example the multi-layer substrate 20 is used to integrate the above-mentioned additional components, too, in addition to the components of the front end module 2 shown in FIG. 1.

The remainder of configuration of the front end module 2 of the first modification example is the same as that of the front end module 2 shown in FIG. 1. According to the first modification example, it is possible to optimize the characteristic of the front end module 2 as a whole including the above-mentioned additional components of the front end module 2.

Figure 13:
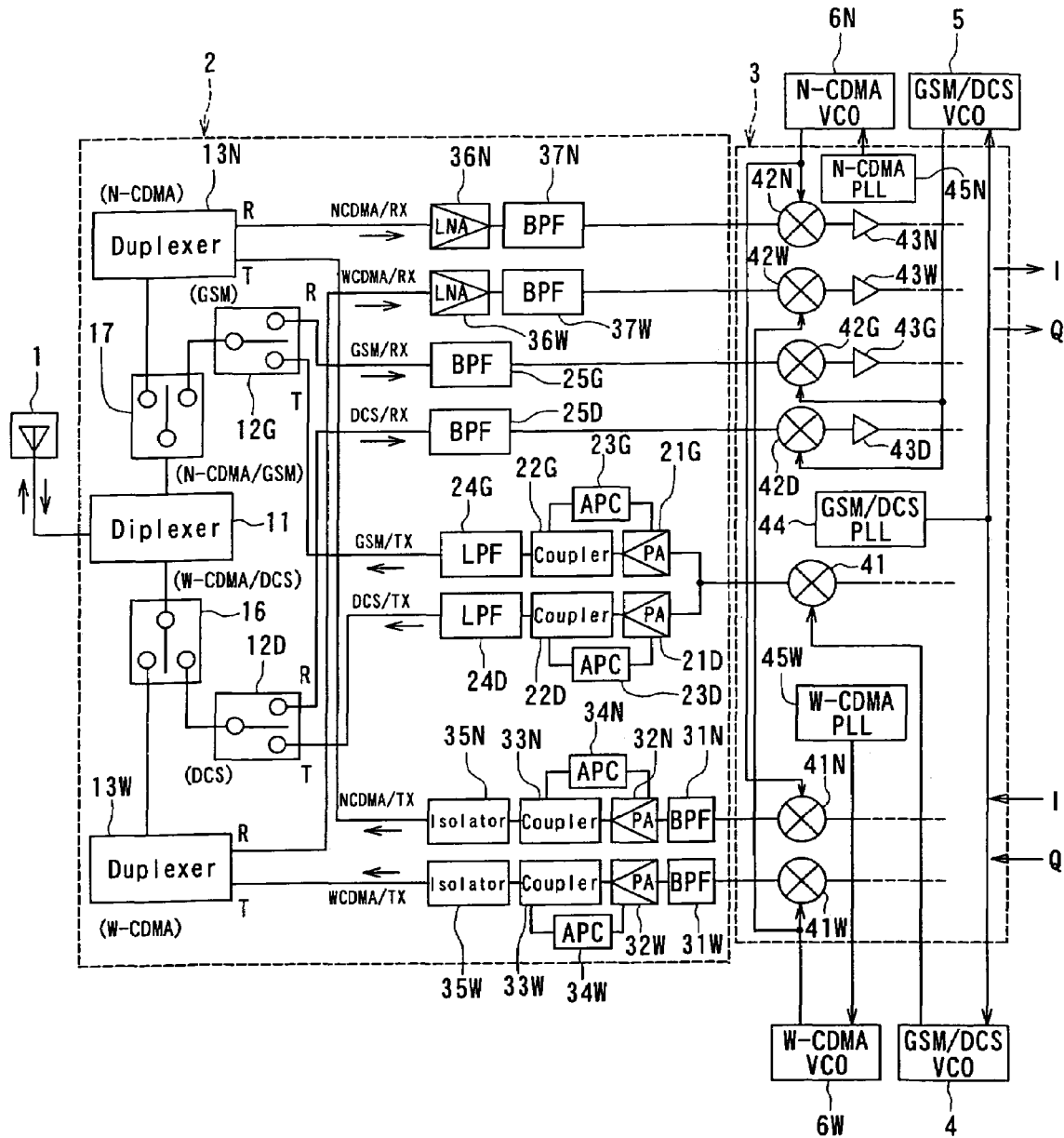
FIG. 13 is a block diagram illustrating a high frequency circuit of a cellular phone including a front end module of a second modification example of the first embodiment of the invention.

FIG. 13 is a block diagram illustrating a high frequency circuit of a cellular phone including the front end module 2 of the second modification example. In addition to the components of the front end module 2 shown in FIG. 1, the front end module 2 of the second modification example comprises the power amplifiers 21G and 21D, the couplers 22G and 22D, the automatic power control circuits 23G and 23D, the LPFs 24G and 24D, the BPFs 25G and 25D, the BPFs 31W and 31N, the power amplifiers 32W and 32N, the couplers 33W and 33N, the automatic power control circuits 34W and 34N, the isolators 35W and 35N, the low-noise amplifiers 36W and 36N, and the BPFs 37W and 37N. In the second modification example the multi-layer substrate 20 is used to integrate the above-mentioned additional components, too, in addition to the components of the front end module 2 shown in FIG. 1.

The remainder of configuration of the front end module 2 of the second modification example is the same as that of the front end module 2 shown in FIG. 1. According to the second modification example, it is possible to optimize the characteristic of the front end module 2 as a whole including the above-mentioned additional components of the front end module 2.

Figure 14:
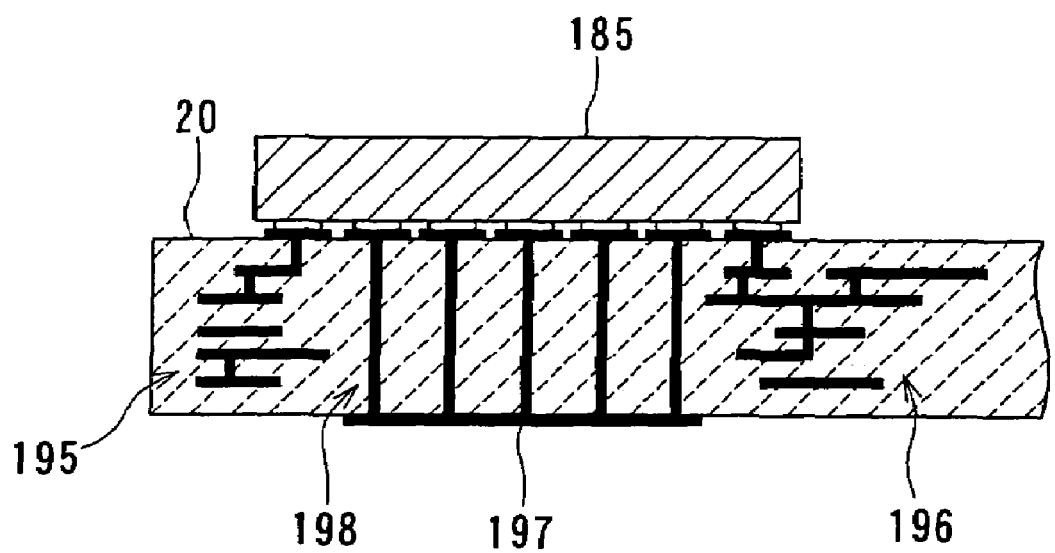
FIG. 14 is a cross-sectional view illustrating an example of arrangement of the power amplifier of the front end module of the second modification example of the first embodiment of the invention.

FIG. 14 is a cross-sectional view illustrating an example of arrangement of the power amplifier 21G of the front end module 2 of the second modification example. In this example the MMIC 185 of the power amplifier 21G is mounted on the multi-layer substrate 20. The power amplifier 21G has the input matching circuit 195 and the output matching circuit 196 each of which is made up of the conductor layer located inside or on the surface of the multi-layer substrate 20. Although not shown, the power amplifier 21G has the capacitors 192 and 193 and the choke coil 194 that are mounted on the multi-layer substrate 20. A conductor layer 197 for releasing the heat generated by the MMIC 185 is formed on a surface of the multi-layer substrate 20 opposite to the surface on which the MMIC 185 is mounted. The multi-layer substrate 20 further has a plurality of via holes 198 for connecting the bottom surface of the MMIC 185 to the conductor layer 197 to introduce the heat generated by the MMIC 185 to the conductor layer 197. The arrangement of each of the power amplifiers 21D, 32W and 32N is the same as that of the power amplifier 21G.

Figure 15:
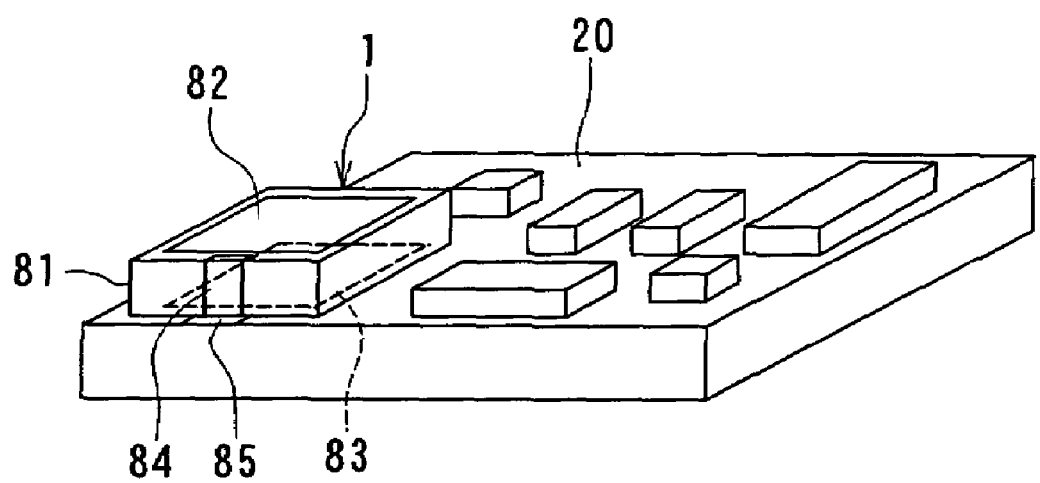
FIG. 15 is a perspective view illustrating a first example of the structure of an antenna of a third modification example of the first embodiment of the invention.
Figure 16:
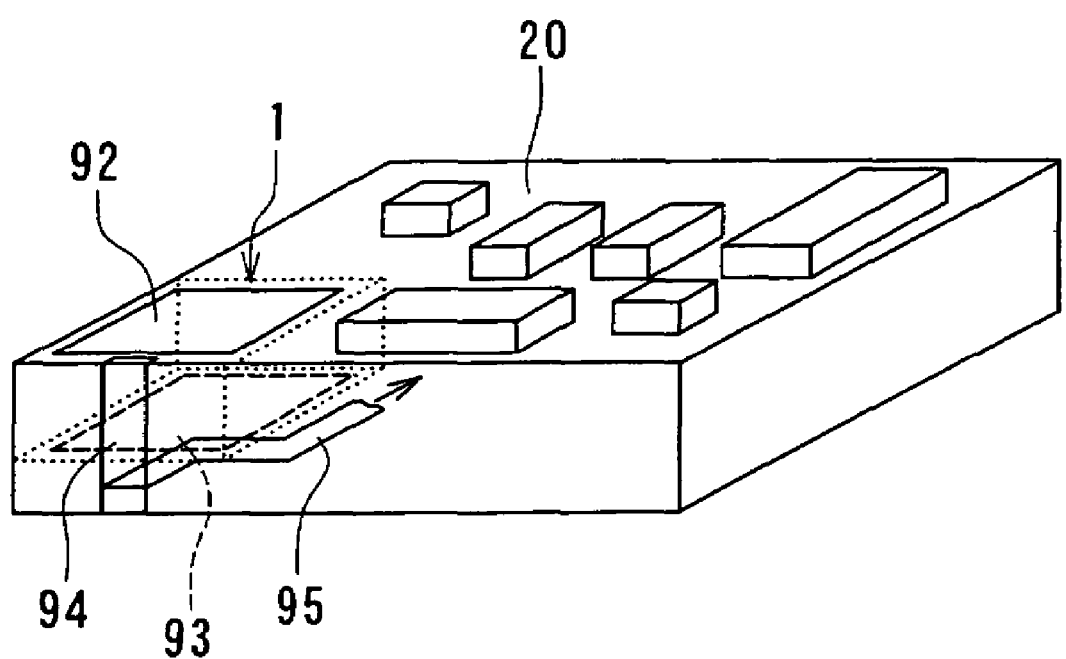
FIG. 16 is a perspective view illustrating a second example of the structure of the antenna of the third modification example of the first embodiment of the invention.

Reference is now made to FIG. 15 and FIG. 16 to describe the third modification example. The front end module 2 of the third modification example is made up of the front end module 2 shown in FIG. 1, FIG. 12 or FIG. 13 that further comprises the antenna 1. In the third modification example the multi-layer substrate 20 is used to integrate the antenna 1, too, in addition to the components of the front end module 2 shown in FIG. 1, FIG. 12 or FIG. 13.

Two examples of the structure of the antenna 1 of the third modification example will now be described. Among antennas of various types and structures known as the antennas used for cellular phones, a patch antenna is used as the antenna 1 of the embodiment.

FIG. 15 is a perspective view illustrating the first example of the structure of the antenna 1. In the first example the antenna 1 is fabricated separately from the multi-layer substrate 20 and mounted on the multi-layer substrate 20 by soldering, for example. The antenna 1 of the first example comprises: a dielectric section 81 made of a dielectric and having the shape of a rectangular solid; an electrode 82 provided on the top surface of the dielectric section 81; a conductor layer 83 provided on the bottom surface of the dielectric section 81 and forming a ground surface; and a conductor section 84 for feeding provided on a side of the dielectric section 81. Each of the electrode 82 and the conductor layer 83 has the shape of a rectangular flat plate. An upper end portion of the conductor section 84 faces toward a side of the electrode 82 with a specific space. A conductor layer 85 connected to a lower end portion of the conductor section 84 is provided on the top surface of the multi-layer substrate 20.

FIG. 16 is a perspective view illustrating the second example of the structure of the antenna 1. In the second example the antenna 1 is incorporated in the multi-layer substrate 20. The antenna 1 of the second example comprises: an electrode 92 provided on the top surface of the multi-layer substrate 20; a conductor layer 93 that is provided in a region inside the multi-layer substrate 20 facing toward the electrode 92 and forms a ground surface; and a conductor section 94 for feeding provided on a side of the the multi-layer substrate 20. Each of the electrode 92 and the conductor layer 93 has the shape of a rectangular flat plate. An upper end portion of the conductor section 94 faces toward a side of the electrode 92 with a specific space. A conductor layer 95 connected to a lower end portion of the conductor section 94 is provided in a region inside the multi-layer substrate 20 located lower than the conductor layer 93.

According to the third modification example, it is possible to optimize the characteristic of the front end module 2 as a whole including the antenna 1.

In the embodiment a duplexer may be used in place of each of the high frequency switches 12G and 12D.

Second Embodiment

A front end module of a second embodiment of the invention will now be described. The front end module of the embodiment is a module for processing transmission signals and reception signals in the frequency band (hereinafter called the AMPS band) used in the advanced mobile phone system (AMPS), transmission signals and reception signals in the frequency band (hereinafter called the PCS band) used in the personal communications service (PCS), and reception signals of the global positioning system (GPS). The reception signals of the GPS are signals used for a position detecting function. The AMPS band corresponds to the first frequency band of the invention. The PCS band corresponds to the second frequency band of the invention. According to the embodiment, each of the transmission signals and the reception signals in the AMPS band and the transmission signals and the reception signals in the PCS band are the signals of the code division multiple access system.

Figure 18:
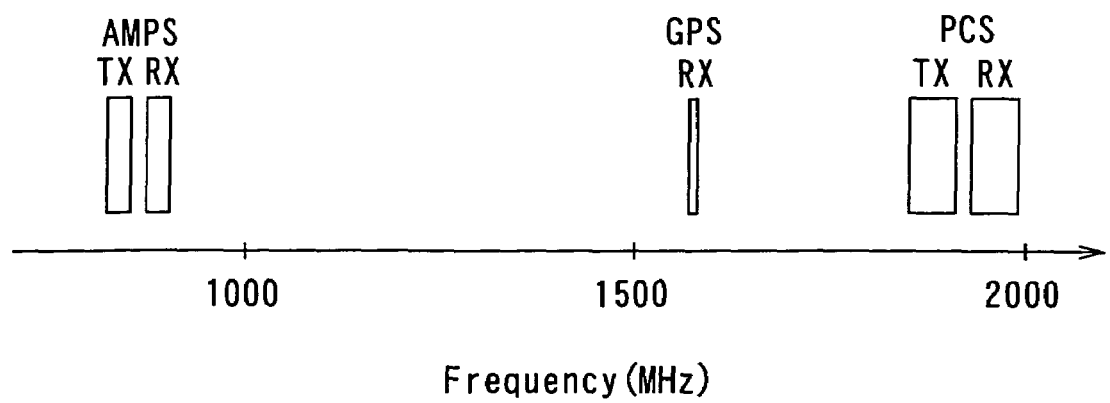
FIG. 18 is a plot illustrating the frequency band of signals processed by the front end module of the second embodiment of the invention.

FIG. 18 shows the frequency bands of the above-mentioned transmission signals and reception signals. In FIG. 18 TX indicates the transmission signals and RX indicates the reception signals. The frequency band of transmission signals in the AMPS band is 824 to 849 MHz. The frequency band of reception signals in the AMPS band is 869 to 894 MHz. The frequency band of transmission signals in the PCS band is 1850 to 1910 MHz. The frequency band of reception signals in the PCS band is 1930 to 1990 MHz. The frequency band of reception signals of the GPS (hereinafter called the GPS band) is 1574 to 1576 MHz.

Figure 17:
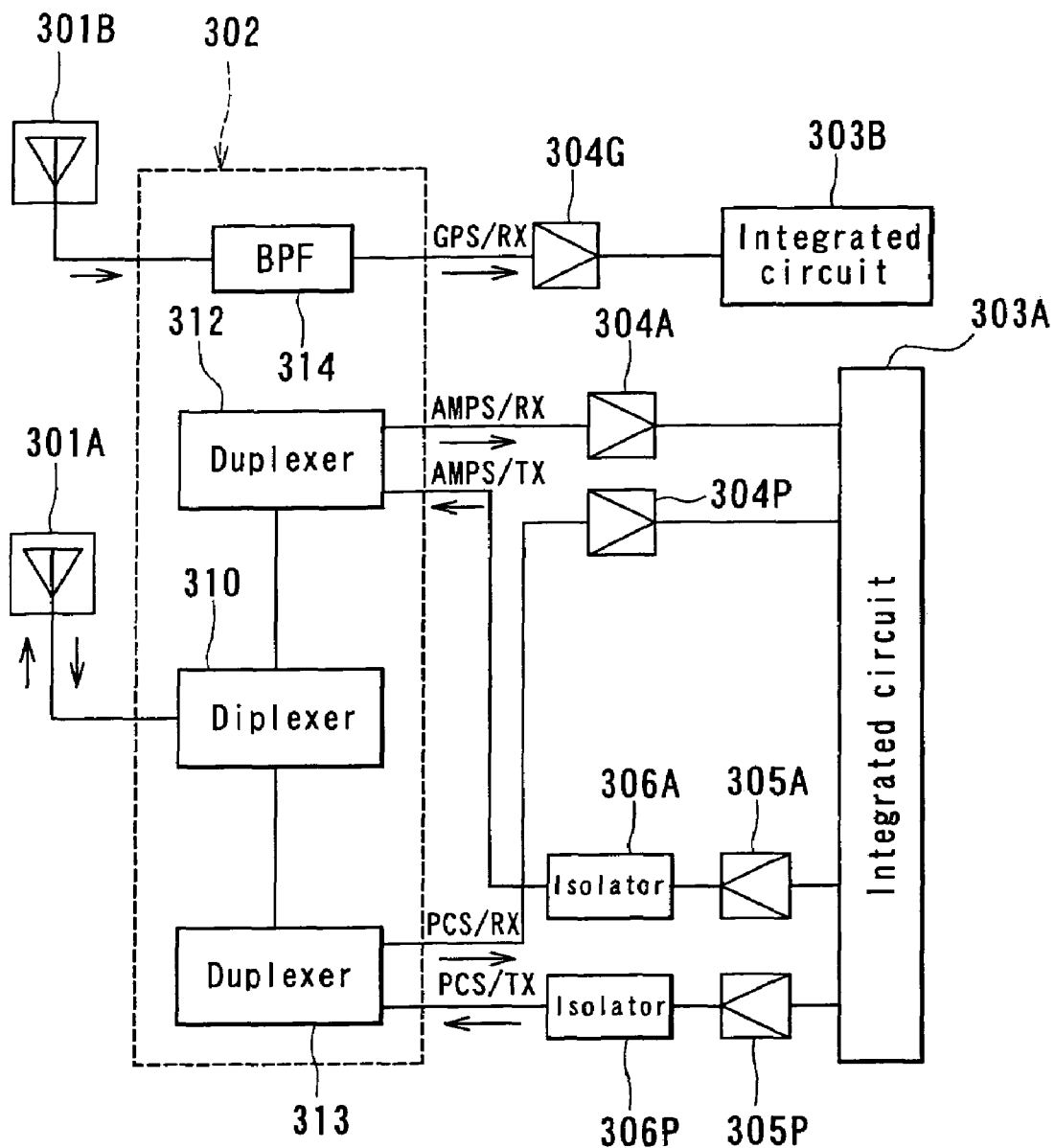
FIG. 17 is a block diagram illustrating an example of a high frequency circuit of a cellular phone including a front end module of a second embodiment of the invention.

Reference is now made to FIG. 17 to describe an example of a high frequency circuit of a cellular phone including the front end module of the second embodiment. The high frequency circuit of FIG. 17 comprises two antennas 301A and 301B and the front end module 302 connected to the antennas 301A and 301B. The antenna 301A is used for transmission and reception of signals in the AMPS band and the PCS band. The antenna 301B is used for reception of reception signals of the GPS.

The high frequency circuit of FIG. 17 further comprises an integrated circuit 303A that mainly performs modulation and demodulation of signals in the AMPS band and the PCS band, and an integrated circuit 303B that mainly performs demodulation of reception signals of the GPS. The high frequency circuit further comprises: two low-noise amplifiers 304A and 304P each having an input connected to the front end module 302 and an output connected to the integrated circuit 303A; and a low-noise amplifier 304G having an input connected to the front end module 302 and an output connected to the integrated circuit 303B. The high frequency circuit further comprises: two power amplifiers 305A and 305P each having an input connected to the integrated circuit 303A; an isolator 306A having an input connected to an output of the power amplifier 305A and an output connected the front end module 302; and an isolator 306P having an input connected to an output of the power amplifier 305P and an output connected the front end module 302.

The front end module 302 comprises a diplexer 310, two duplexers 312 and 313, and a BPF 314. The diplexer 310 corresponds to the first separating means of the invention. The duplexer 312 corresponds to the second separating means of the invention. The duplexer 313 corresponds to the third separating means of the invention.

The diplexer 310 has first to third ports. The first port is connected to the antenna 301A. The second port is connected to the duplexer 312. The third port is connected to the duplexer 313. The diplexer 310 separates the AMPS band and the PCS band from each other. That is, the diplexer 310 outputs from the first port transmission signals in the AMPS band inputted to the second port, and outputs from the second port reception signals in the AMPS band inputted to the first port. The diplexer 310 outputs from the first port transmission signals in the PCS band inputted to the third port, and outputs from the third port reception signals in the PCS band inputted to the first port.

The duplexer 312 has a common terminal, a transmission terminal and a reception terminal. The common terminal is connected to the second port of the diplexer 310. The transmission terminal is connected to the output of the isolator 306A. The reception terminal is connected to the input of the low-noise amplifier 304A. The duplexer 312 separates the transmission signals (indicated as AMPS/TX in the drawings) and reception signals (indicated as AMPS/RX in the drawings) in the AMPS band from each other. That is, the duplexer 312 outputs from the common terminal transmission signals in the AMPS band inputted to the transmission terminal, and outputs from the reception terminal reception signals in the AMPS band inputted to the common terminal.

The duplexer 313 has a common terminal, a transmission terminal and a reception terminal. The common terminal is connected to the third port of the diplexer 310. The transmission terminal is connected to the output of the isolator 306P. The reception terminal is connected to the input of the low-noise amplifier 304P. The duplexer 313 separates the transmission signals (indicated as PCS/TX in the drawings) and reception signals (indicated as PCS/RX in the drawings) in the PCS band from each other. That is, the duplexer 313 outputs from the common terminal transmission signals in the PCS band inputted to the transmission terminal, and outputs from the reception terminal reception signals in the PCS band inputted to the common terminal.

The BPF 314 has an input connected to the antenna 301B and an output connected to the input of the low-noise amplifier 304G. The BPF 314 selectively allows reception signals (indicated as GPS/RX in the drawings) of the GPS received at the antenna 301B to pass therethrough.

Figure 19:
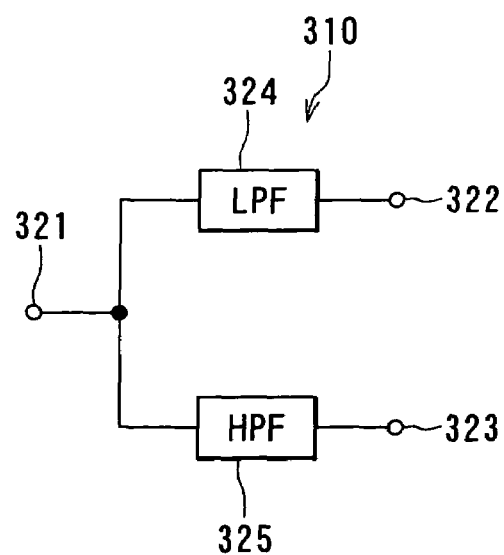
FIG. 19 is a block diagram illustrating an example of the structure of the diplexer of FIG. 17.

Reference is now made to FIG. 19 to describe the configuration of the diplexer 310. The diplexer 310 has first to third ports 321 to 323, an LPF 324 and an HPF 325. Each of the LPF 324 and the HPF 325 has an end connected to the first port 321. The LPF 324 has the other end connected to the second port 322. The HPF 325 has the other end connected to the third port 323.

Figure 20:
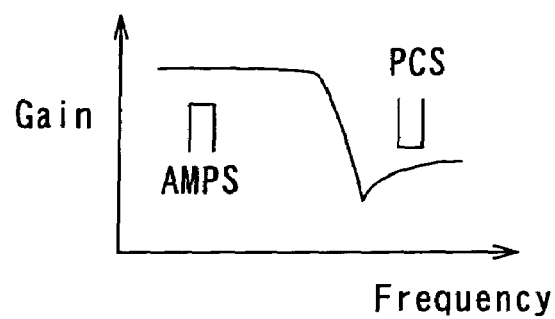
FIG. 20 is a plot illustrating the characteristic of the low-pass filter of FIG. 19.

FIG. 20 schematically illustrates the characteristic of the LPF 324, that is, the relationship between the frequency and the gain. As shown in FIG. 20, the LPF 324 allows the signals of the frequencies in the AMPS band to pass therethrough and intercepts the signals of the frequencies in the PCS band. Alternatively, in place of the LPF 324, a notch filter of high frequency rejection type for allowing the signals of the frequencies in the AMPS band to pass therethrough and intercepting the signals of the frequencies in the PCS band may be employed.

Figure 21:
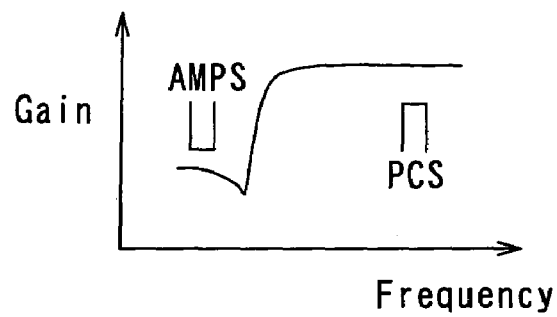
FIG. 21 is a plot illustrating the characteristic of the high-pass filter of FIG. 19.

FIG. 21 schematically illustrates the characteristic of the HPF 325, that is, the relationship between the frequency and the gain. As shown in FIG. 21, the HPF 325 allows the signals of the frequencies in the PCS band to pass therethrough and intercepts the signals of the frequencies in the AMPS band. Alternatively, in place of the HPF 325, a notch filter of low frequency rejection type for allowing the signals of the frequencies in the PCS band to pass therethrough and intercepting the signals of the frequencies in the AMPS band may be employed.

Figure 22:
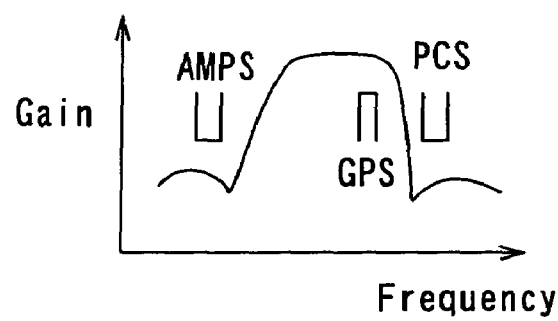
FIG. 22 is a plot illustrating the characteristic of the band-pass filter of FIG. 17.

FIG. 22 schematically illustrates the characteristic of the BPF 314 of FIG. 17, that is, the relationship between the frequency and the gain. As shown in FIG. 22, the BPF 314 allows the signals of the frequencies in the GPS band to pass therethrough and intercepts the signals of the frequencies in the AMPS band and the PCS band.

Reference is now made to FIG. 23 to FIG. 26 to describe examples of the configurations of the filters used in the diplexer 310.

Figure 23:
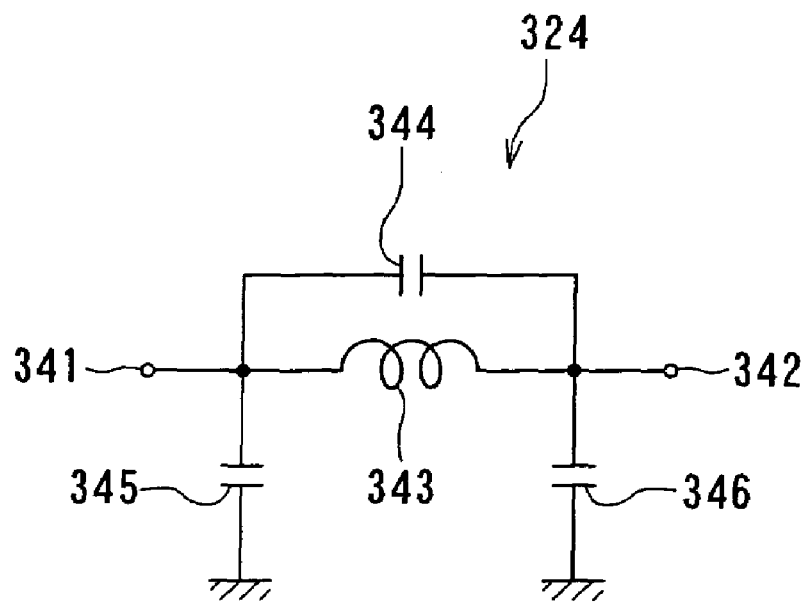
FIG. 23 is a schematic diagram illustrating an example of the configuration of the low-pass filter of FIG. 19.

FIG. 23 is a schematic diagram illustrating an example of the configuration of the LPF 324. The LPF 324 has two terminals 341 and 342, an inductor 343 and three capacitors 344 to 346. The inductor 343 has an end connected to the terminal 341 and the other end connected to the terminal 342. The capacitor 344 has an end connected to the terminal 341 and the other end connected to the terminal 342. The capacitor 345 has an end connected to the terminal 341 and the other end grounded. The capacitor 346 has an end connected to the terminal 342 and the other end grounded.

Figure 24:
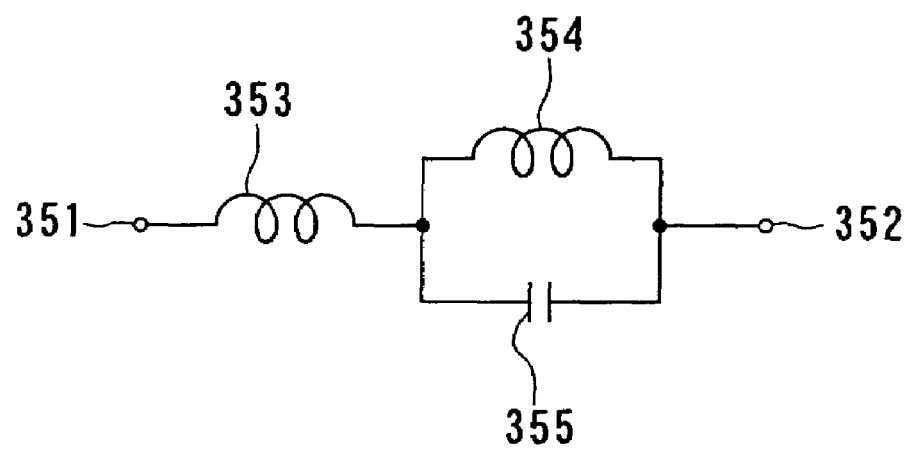
FIG. 24 is a schematic diagram illustrating an example of the configuration of a notch filter of high frequency rejection type capable of being used in place of the low-pass filter of FIG. 23.

FIG. 24 is a schematic diagram illustrating an example of the configuration of a notch filter of high frequency rejection type capable of being used in place of the LPF 324 of FIG. 23. The notch filter has two terminals 351 and 352, two inductors 353 and 354 and a capacitor 355. The inductor 353 has an end connected to the terminal 351. The inductor 354 has an end connected to the other end of the inductor 353 and the other end connected to the terminal 352. The capacitor 355 has an end connected to the other end of the inductor 353 and the other end connected to the terminal 352.

Figure 25:
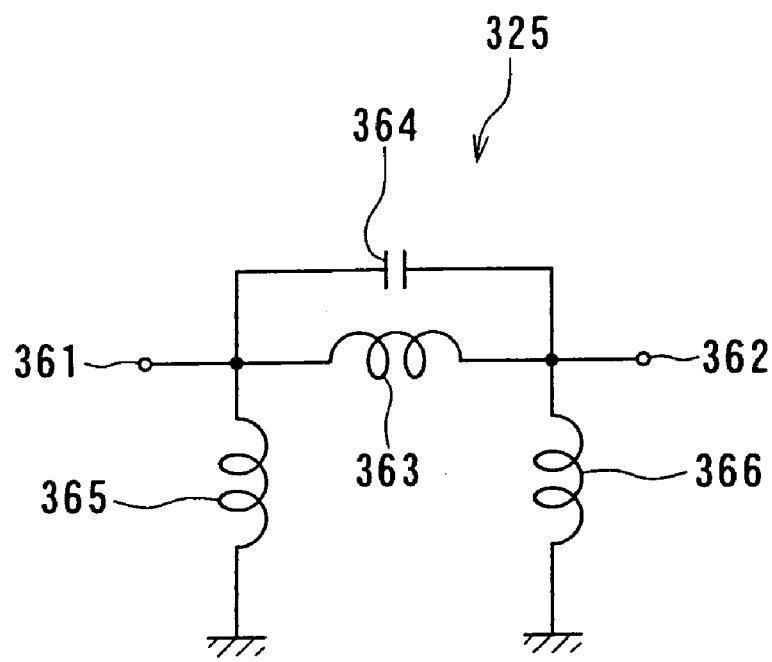
FIG. 25 is a schematic diagram illustrating an example of the configuration of the high-pass filter of FIG. 19.

FIG. 25 is a schematic diagram illustrating an example of the configuration of the HPF 325. The HPF 325 has two terminals 361 and 362, three inductors 363, 365 and 366, and a capacitor 364. The inductor 363 has an end connected to the terminal 361 and the other end connected to the terminal 362. The capacitor 364 has an end connected to the terminal 361 and the other end connected to the terminal 362. The inductor 365 has an end connected to the terminal 361 and the other end grounded. The inductor 366 has an end connected to the terminal 362 and the other end grounded.

Figure 26:
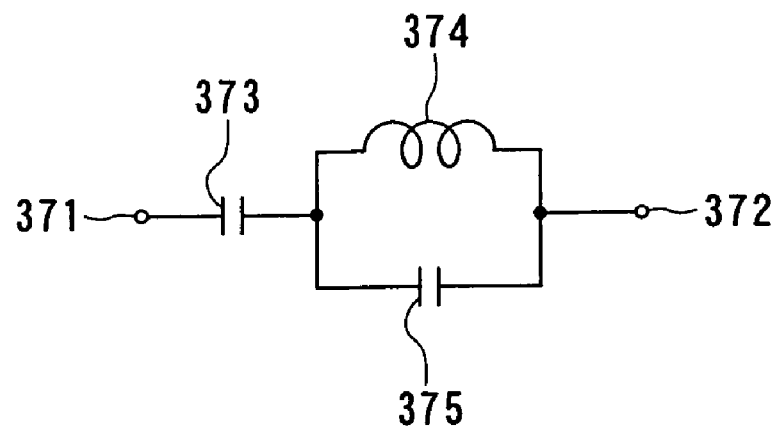
FIG. 26 is a schematic diagram illustrating an example of the configuration of a notch filter of low frequency rejection type capable of being used in place of the high-pass filter of FIG. 25.

FIG. 26 is a schematic diagram illustrating an example of the configuration of a notch filter of low frequency rejection type capable of being used in place of the HPF 325 of FIG. 25. The notch filter has two terminals 371 and 372, two capacitors 373 and 375, and an inductor 374. The capacitor 373 has an end connected to the terminal 371. The inductor 374 has an end connected to the other end of the capacitor 373 and the other end connected to the terminal 372. The capacitor 375 has an end connected to the other end of the capacitor 373 and the other end connected to the terminal 372.

Figure 27:
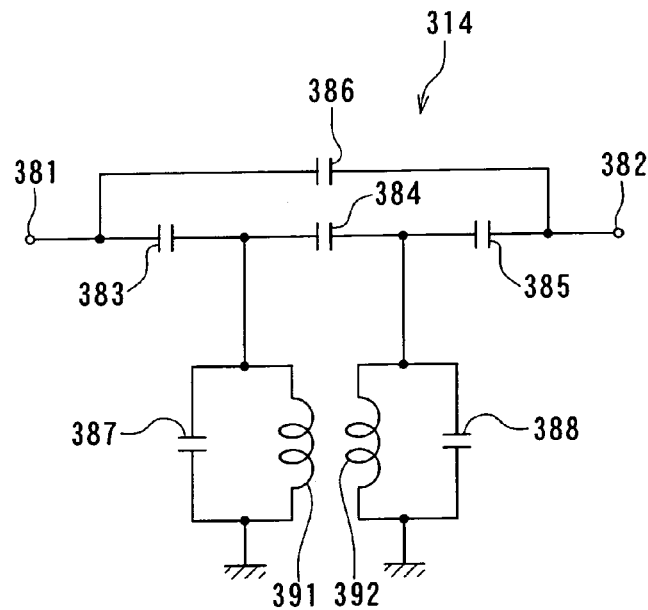
FIG. 27 is a schematic diagram illustrating an example of the configuration of the band-pass filter of FIG. 17.

Reference is now made to FIG. 27 to describe an example of the configuration of the BPF 314. FIG. 27 is a schematic diagram illustrating the example of the configuration of the BPF 314. The BPF 314 has two terminals 381 and 382, six capacitors 383 to 388, and two inductors 391 and 392. The capacitor 383 has an end connected to the terminal 381. The capacitor 384 has an end connected to the other end of the capacitor 383. The capacitor 385 has an end connected to the other end of the capacitor 384 and the other end connected to the terminal 382. The capacitor 386 has an end connected to the terminal 381 and the other end connected to the terminal 382. The capacitor 387 has an end connected to the node between the capacitors 383 and 384 and the other end grounded. The capacitor 388 has an end connected to the node between the capacitors 384 and 385 and the other end grounded. The inductor 391 has an end connected to one of the ends of the capacitor 387 and the other end grounded. The inductor 392 has an end connected to one of the ends of the capacitor 388 and the other end grounded.

Figure 28:
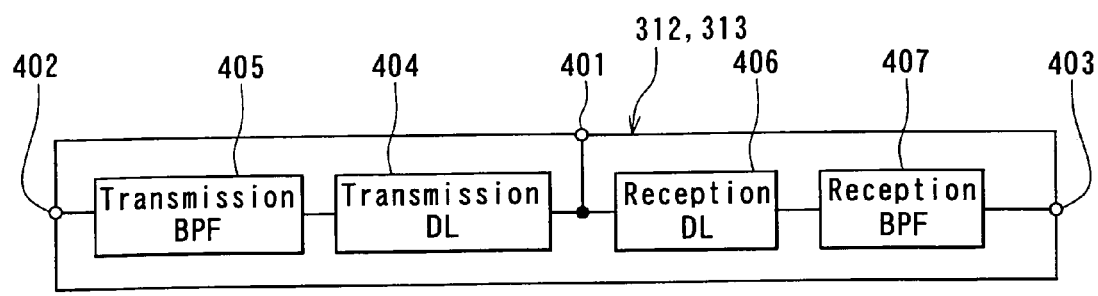
FIG. 28 is a block diagram illustrating an example of the configuration of the duplexer of FIG. 17.

Reference is now made to FIG. 28 to describe an example of the circuit configuration of the duplexers 312 and 313. The duplexer 312 or 313 of FIG. 28 has a common terminal 401, a transmission terminal 402 and a reception terminal 403. The common terminal 401 is connected to the diplexer 310. The transmission terminal 402 is connected to the isolator 306A or the isolator 306P. The reception terminal 403 is connected to the low-noise amplifier 304A or the low-noise amplifier 304P.

The duplexer 312 or 313 further has: a transmission-side delay line (indicated as transmission DL in FIG. 28) 404 having an end connected to the common terminal 401; and a transmission-side BPF 405 having an output connected to the other end of the delay line 404 and an input connected to the transmission terminal 402. The duplexer 312 or 313 further has: a reception-side delay line (indicated as reception DL in FIG. 28) 406 having an end connected to the common terminal 401; and a reception-side BPF 407 having an input connected to the other end of the delay line 406 and an output connected to the reception terminal 403. Each of the BPFs 405 and 407 is made up of an acoustic wave element.

The transmission-side delay line 404 and the reception-side delay line 406 are adjusted such that the impedance described below is obtained when the duplexer 312 or 313 is seen from each of the terminals 401, 402 and 403. When the duplexer 312 or 313 is seen from the common terminal 401, the impedance is nearly 50 ohms in the frequency band of the transmission signal and the frequency band of the reception signal. When the duplexer 312 or 313 is seen from the transmission terminal 402, the impedance is nearly 50 ohms in the frequency band of the transmission signal and the impedance is sufficiently high in the frequency band of the reception signal. When the duplexer 312 or 313 is seen from the reception terminal 403, the impedance is nearly 50 ohms in the frequency band of the reception signal and the impedance is sufficiently high in the frequency band of the transmission signal. Depending on the configurations of the BPFs 405 and 407, one of the transmission-side delay line 404 and the reception-side delay line 406 may be only provided in some cases.

Figure 29:
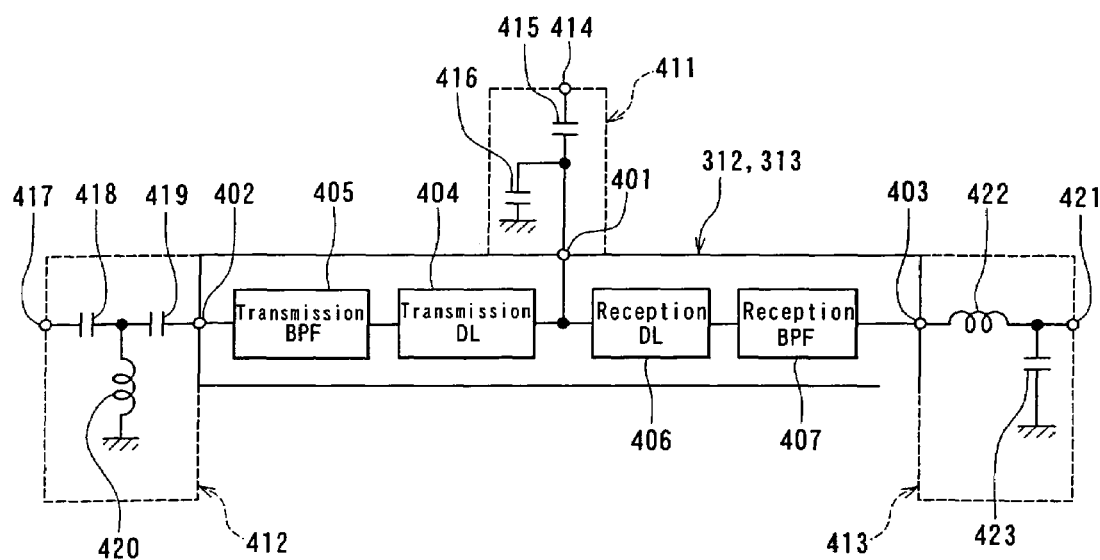
FIG. 29 is a schematic diagram illustrating an example of the circuit configuration of the duplexer of FIG. 17 and a matching circuit connected thereto.

To implement the above-described relationship of the impedances, a matching circuit may be provided, if necessary, between each of the common terminal 401, the transmission terminal 402 and the reception terminal 403 of the duplexer 312 or 313 and the external circuit connected thereto. FIG. 29 is a schematic diagram illustrating an example of the circuit configuration of the duplexer 312 or 313 and the matching circuits connected thereto. The duplexer 312 or 313 of the example shown in FIG. 29 has a configuration the same as that of the duplexer 312 or 313 of FIG. 28. In the example shown in FIG. 29 the matching circuit 411 is connected to the common terminal 401, the matching circuit 412 is connected to the transmission terminal 402, and the matching circuit 413 is connected to the reception terminal 403. The matching circuits 411, 412 and 413 are included in the front end module 302.

The matching circuit 411 has a terminal 414 and two capacitors 415 and 416. The terminal 414 is connected to the diplexer 310. The capacitor 415 has an end connected to the terminal 414 and the other end connected to the common terminal 401. The capacitor 416 has an end connected to the common terminal 401 and the other end grounded.

The matching circuit 412 has a terminal 417, two capacitors 418 and 419, and an inductor 420. The capacitor 418 has an end connected to the terminal 417. The capacitor 419 has an end connected to the other end of the capacitor 418 and the other end connected to the transmission terminal 402. The inductor 420 has an end connected to the other end of the capacitor 418 and the other end grounded.

The matching circuit 413 has a terminal 421, an inductor 422 and a capacitor 423. The inductor 422 has an end connected to the reception terminal 403 and the other end connected to the terminal 421. The capacitor 423 has an end connected to the terminal 421 and the other end grounded.

Figure 30:
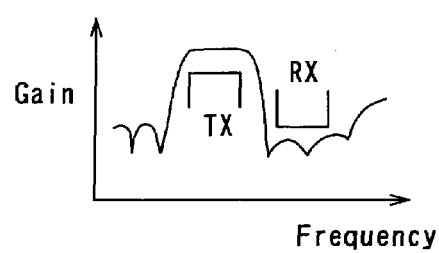
FIG. 30 is a plot illustrating the characteristic of the transmission-side band-pass filter of FIG. 28 or FIG. 29.

FIG. 30 schematically illustrates the characteristic of the transmission-side BPF 405 of the duplexer 312 or 313, that is, the relationship between the frequency and the gain. As shown in FIG. 30, the BPF 405 allows transmission signals (indicated as TX in FIG. 30) to pass therethrough and intercepts the reception signals (indicated as RX in FIG. 30).

Figure 31:
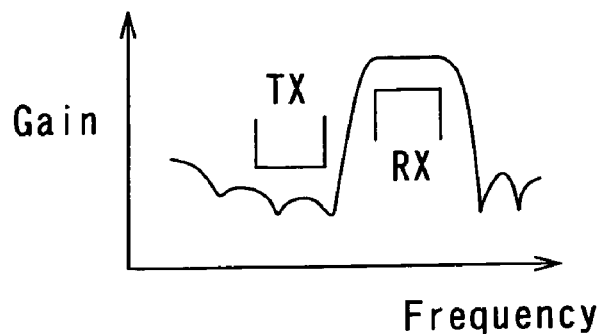
FIG. 31 is a plot illustrating the characteristic of the reception-side band-pass filter of FIG. 28 or FIG. 29.

FIG. 31 schematically illustrates the characteristic of the reception-side BPF 407 of the duplexer 312 or 313, that is, the relationship between the frequency and the gain. As shown in FIG. 31, the BPF 407 allows reception signals (indicated as RX in FIG. 31) to pass therethrough and intercepts the transmission signals (indicated as TX in FIG. 31).

Figure 32:
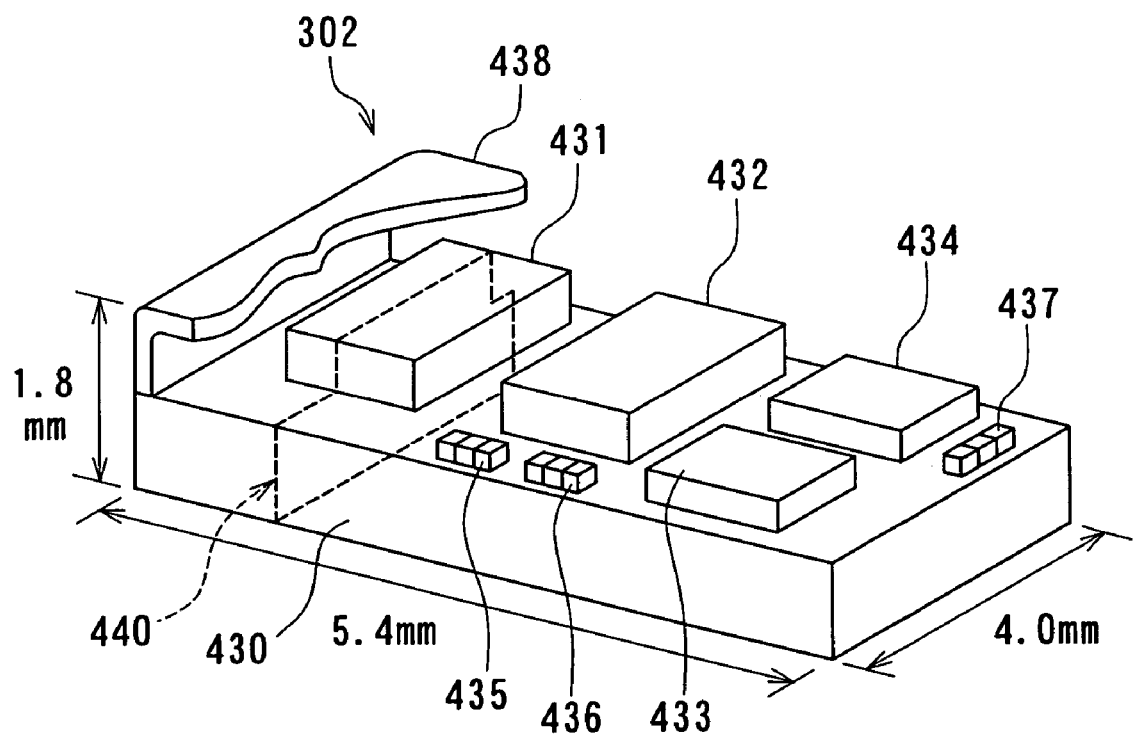
FIG. 32 is a perspective view illustrating an example of the appearance of the front end module of the second embodiment of the invention.

Reference is now made to FIG. 32 to FIG. 35 to describe the structure of the front end module 302. FIG. 32 is a perspective view illustrating an example of the appearance of the front end module 302. As shown in FIG. 32, the front end module 302 comprises a single multi-layer substrate 430 for integration. The multi-layer substrate 430 is used to integrate the diplexer 310, the two duplexers 312 and 313, and the BPF 314. The multi-layer substrate 430 has a structure in which dielectric layers and patterned conductor layers are alternately stacked. The multi-layer substrate 430 may be a multi-layer low-temperature co-fired ceramic substrate, for example. The circuits of the front end module 302 are made up of the conductor layers located inside or on the surface of the multi-layer substrate 430 and the components mounted thereon. In particular, the diplexer 310 is made up of the conductor layer located inside or on the surface of the multi-layer substrate 430.

As shown in FIG. 28, each of the duplexers 312 and 313 has the two BPFs 405 and 407 each of which is made up of an acoustic wave element. BPFs made up of dielectric resonators have been utilized for a long time. However, the BPFs made up of dielectric resonators are large and heavy so that they are not suitable for reducing the size and weight of a front end module. According to the embodiment, the duplexers 312 and 313 have the BPFs 405 and 407 each of which is made up of an acoustic wave element, so that it is possible to reduce the front end module 302 in size and weight.

Although surface acoustic wave elements are used as the acoustic wave elements in the examples herein described, bulk acoustic wave elements or thin-film bulk acoustic wave elements, in particular, may be used in place of the surface acoustic wave elements, as in the first embodiment.

In FIG. 32 numerals 431 and 432 indicate chips including the surface acoustic wave elements used in the BPFs 405 and 407 of the duplexer 312. Numerals 433 and 434 indicate the chips including the surface acoustic wave elements used in the BPFs 405 and 407 of the duplexer 313. The chips 431 to 434 are mounted on the top surface of the multi-layer substrate 430. At least part of the circuit portion of the duplexers 312 and 313 except the surface acoustic wave elements is made up of the conductor layers located inside or on the surface of the multi-layer substrate 430. FIG. 32 shows the example in which part of the circuit portion of the duplexer 312 or 313 except the surface acoustic wave elements is made up of chip components 435 to 437 mounted on the top surface of the multi-layer substrate 430, and the remainder of the circuit portion of the duplexer 312 or 313 except the surface acoustic wave elements is made up of the conductor layers located inside or on the surface of the multi-layer substrate 430. However, it is possible that the circuit portion of the duplexer 312 or 313 except the surface acoustic wave elements is made up of inductors and capacitors, so that the entire circuit portion of the duplexer 312 or 313 except the surface acoustic wave elements may be made up of the conductor layers located inside or on the surface of the multi-layer substrate 430.

The top surface of the multi-layer substrate 430, and the chips 431 to 434 and the chip components 435 to 437 mounted on the top surface are covered with a shield case 438.

Figure 33:
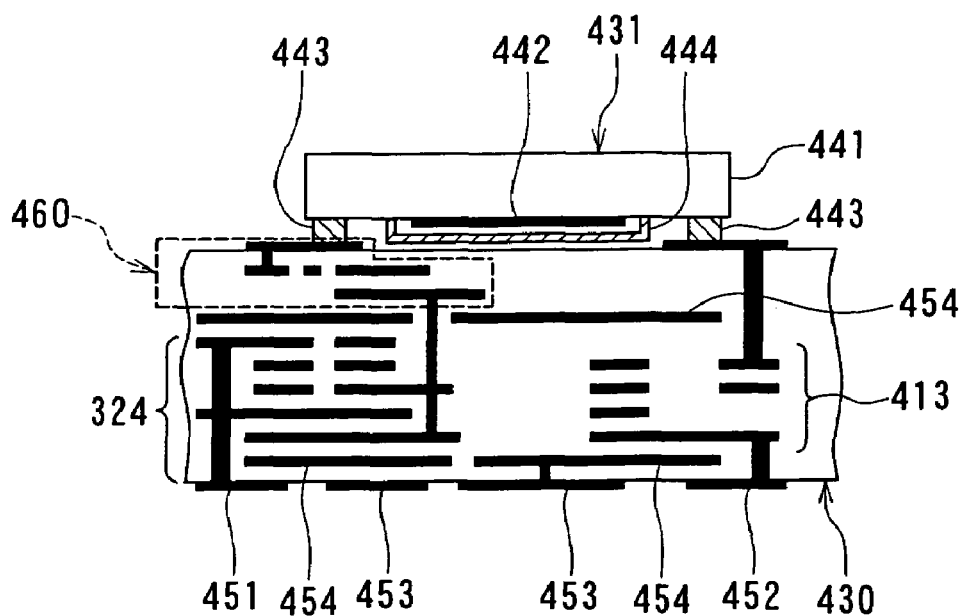
FIG. 33 is a cross-sectional view of the front end module of FIG. 32.

FIG. 33 illustrates a cross section indicated with 440 in FIG. 32. As shown in FIG. 33, the chip 431 has: a piezo-electric substrate 441 made of a piezoelectric material such as $LiTaO_3$; an inter-digital electrode 442 formed on one of the surfaces of the piezoelectric substrate 441; a connecting electrode 443 for connecting the inter-digital electrode 442 to an external circuit; and a cover 444 for covering the inter-digital electrode 442. The connecting electrode 443 is disposed in the same plane as the inter-digital electrode 442. A space is created between the inter-digital electrode 442 and the cover 444. The chip 431 is mounted on the top surface of the multi-layer substrate 430 by flip-chip bonding so that the inter-digital electrode 442 faces toward the top surface of the multi-layer substrate 430. The structure and the mounting method of each of the chips 432 to 434 are the same as those of the chip 431.

In FIG. 33 numeral 451 indicates an antenna terminal connected to the antenna 301A, numeral 452 indicates an output terminal for outputting reception signals in the AMPS band, and numeral 453 indicates a ground terminal. The terminals 451 to 453 are located on the bottom surface of the multi-layer substrate 430. Numeral 454 indicates a ground layer disposed inside the multi-layer substrate 430. The ground layer 454 is connected to the ground terminal 453.

Figure 34:
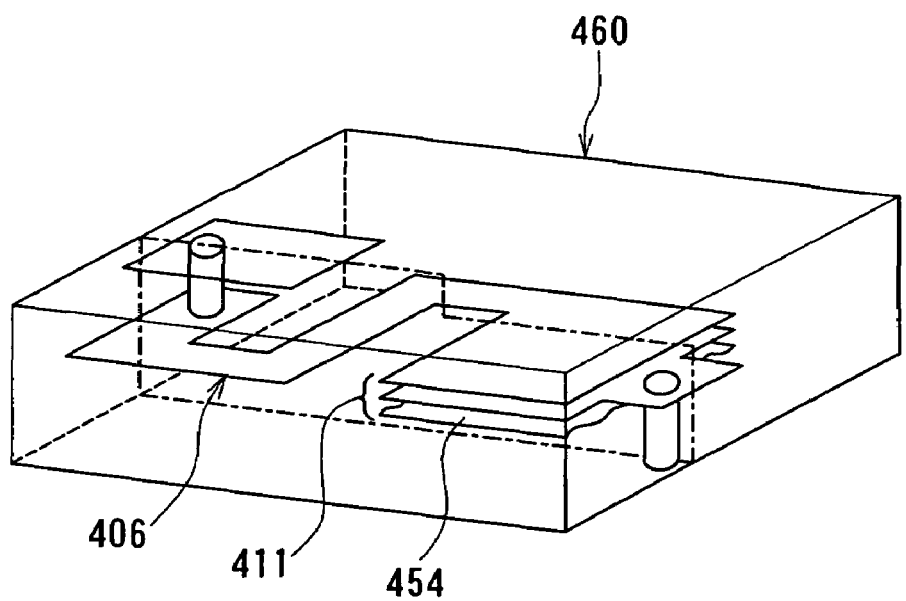
FIG. 34 is a perspective view illustrating a portion of FIG. 33.

In the example shown in FIG. 33, the chip 431 is designed to make up the reception-side BPF 407 of the duplexer 312. FIG. 33 shows the LPF 32 of FIG. 23, the matching circuit 411 of FIG. 29, the reception-side delay line 406 of FIG. 29, and the matching circuit 413 of FIG. 29 as an example of the circuit portion formed inside the multi-layer substrate 430. FIG. 34 is a perspective view of the portion indicated with numeral 460 in FIG. 33, that is, the matching circuit 411 and the delay line 406.

Figure 35:
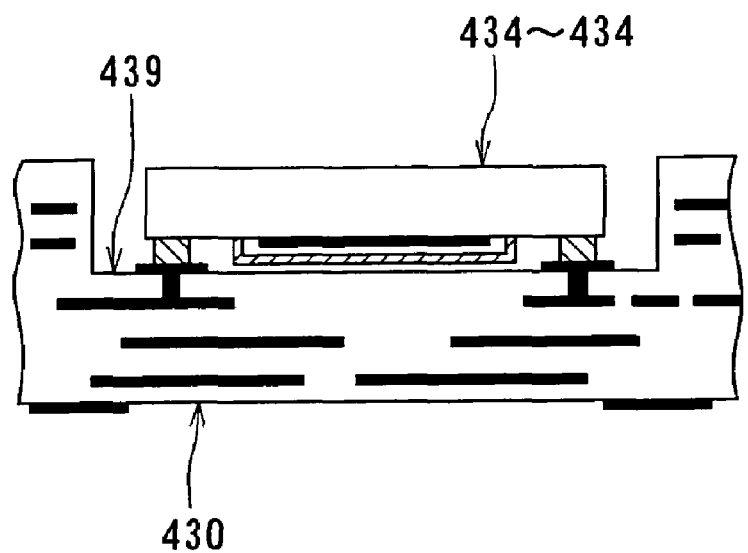
FIG. 35 is a cross-sectional view illustrating another example of the structure of the front end module of the second embodiment of the invention.

In the example shown in FIG. 32, the multi-layer substrate 430 has a flat top surface on which the chips 431 to 434 are mounted. In another example, as shown in FIG. 35, four concave portions 439 for accommodating the chips 431 to 434 may be formed in the top surface of the multi-layer substrate 430, and the chips 431 to 434 may be disposed in the respective concave portions 439.

The front end module 302 of FIG. 32 has a length of 5.4 mm, a width of 4.0 mm and a height of 1.8 mm, for example.

Reference is now made to FIG. 36 to FIG. 42 to describe a reference front end module compared with the front end module 302 of the embodiment of the invention. The reference front end module has a circuit configuration the same as that of the front end module 302 of FIG. 17. However, the reference front end module is formed such that the diplexer and the two duplexers are discrete components and they are mounted on a motherboard by a method such as soldering.

Figure 36:
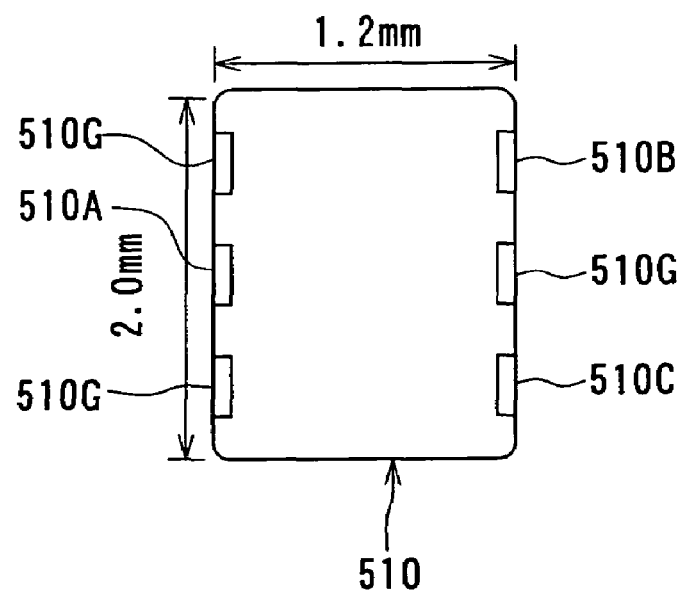
FIG. 36 is a top view illustrating an example of the appearance of a diplexer of a reference front end module.

FIG. 36 is a top view illustrating an example of the appearance of the diplexer 510 of the reference front end module. The diplexer 510 of FIG. 36 has terminals 510A, 510B and 510C corresponding to the first to third ports, and three ground terminals 510G. In the example shown in FIG. 36 the diplexer 510 has a length of 2.0 mm and a width of 1.2 mm.

Figure 37:
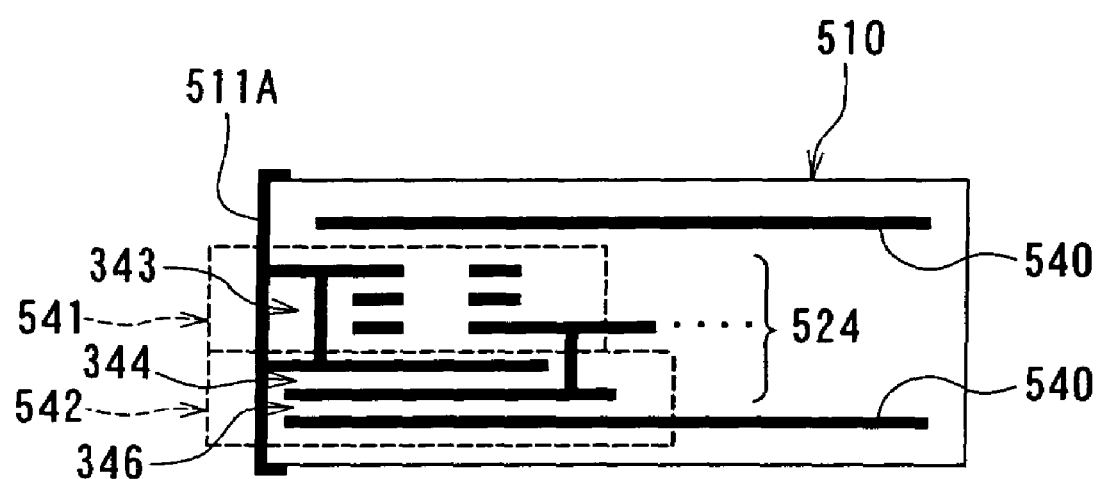
FIG. 37 is a cross-sectional view of the diplexer of FIG. 36.
Figure 38:
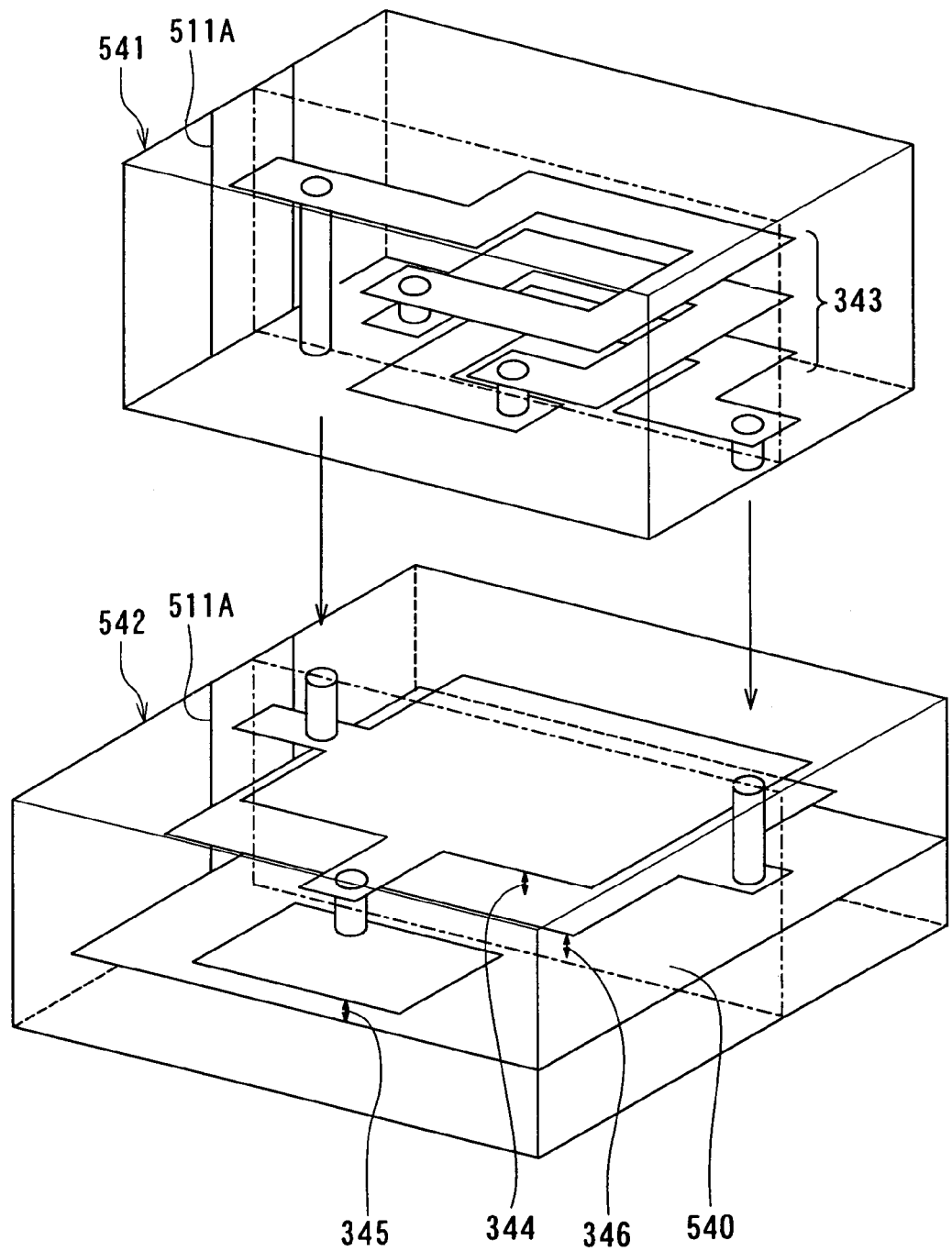
FIG. 38 is an exploded perspective view illustrating a portion of FIG. 37.

FIG. 37 is a cross-sectional view of the diplexer 510 of FIG. 36. FIG. 38 is an exploded perspective view illustrating the portions indicated with numerals 541 and 542 in FIG. 37. As shown in FIG. 37, the diplexer 510 has a multi-layer substrate. In FIG. 37 and FIG. 38 a terminal 511A and an LPF 524 connected to the terminal 511A are shown. The LPF 524 is made of the conductor layer located inside or on the surface of the multi-layer substrate. The LPF 524 has a configuration as shown in FIG. 23. That is, the LPF 524 has the inductor 343 and the three capacitors 344 to 346. In FIG. 37 numeral 540 indicates a ground layer.

Figure 39:
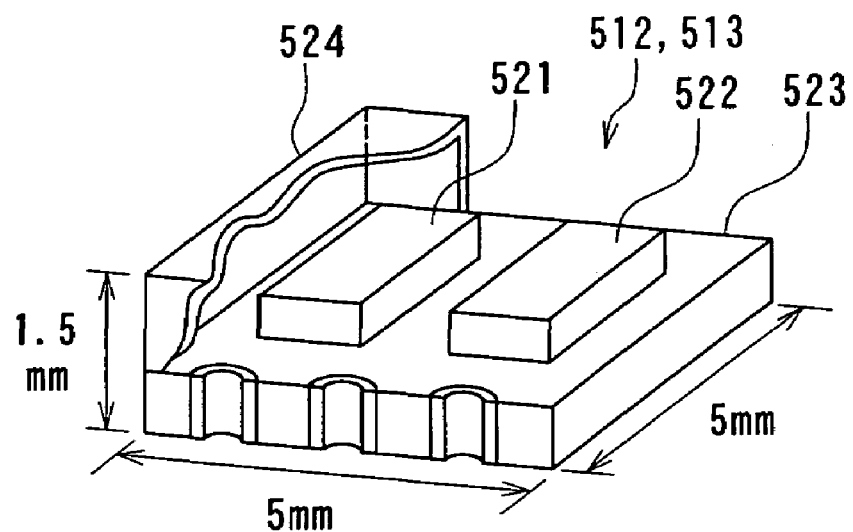
FIG. 39 is a perspective view illustrating an example of the appearance of the duplexer of the reference example.

FIG. 39 is a perspective view illustrating an example of the appearance of the duplexer 512 or 513 of the reference front end module. The duplexer 512 or 513 of FIG. 39 has: two chips 521 and 522 each of which includes a surface acoustic wave element used in the BPF; a mounting board 523 on which the two chips 521 and 522 are mounted; and a shield case 524 for covering the chips 521 and 522. The mounting board 523 is a multi-layer substrate. In the example shown in FIG. 39 the duplexer 512 or 513 has a length of 5 mm, a width of 5 mm and a height of 1.5 mm.

Figure 40:
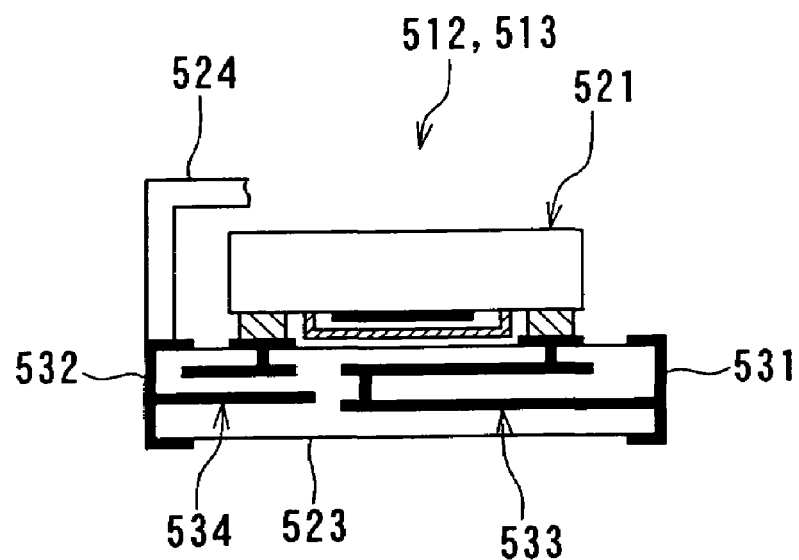
FIG. 40 is a cross-sectional view of the duplexer of FIG. 39.

FIG. 40 illustrates a cross section passing through the chip 521 of FIG. 39. The chip 521 of FIG. 40 has a structure the same as that of the chip 431 of FIG. 33. FIG. 40 shows a common terminal 531, a reception terminal 532, a reception-side delay line 533 and a matching circuit 534. The delay line 533 and the matching circuit 534 are made up of the conductor layers located inside or on the surface of the mounting board 523.

Figure 41:
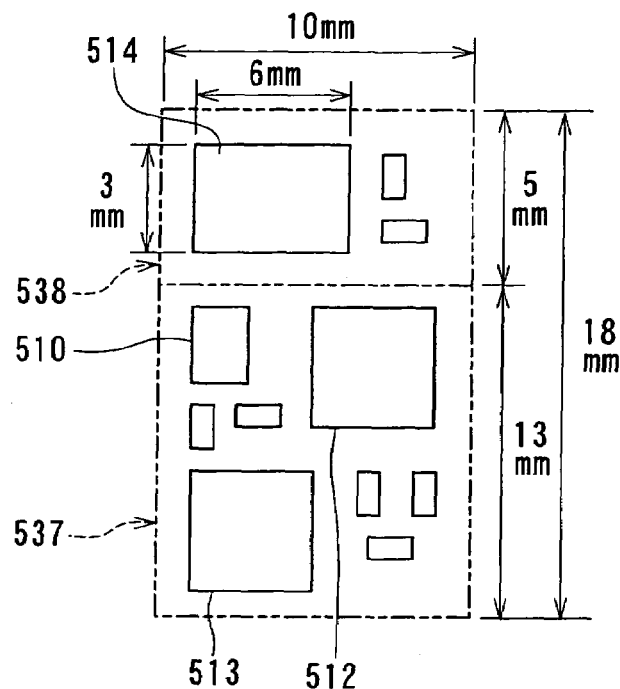
FIG. 41 is a top view illustrating an example of arrangement of the components of the reference front end module.
Figure 42:
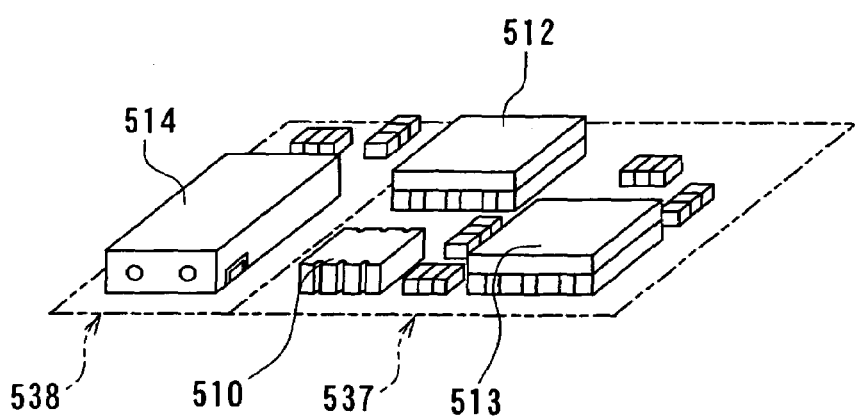
FIG. 42 is a perspective view illustrating the example of arrangement of the components of the reference front end module.

FIG. 41 is a top view illustrating an example of arrangement of the components of the reference front end module. FIG. 42 is a perspective view illustrating this example of arrangement. In this example a first region 537 and a second region 538 are provided on the motherboard. In the first region 537 the diplexer 510, the duplexers 512 and 513, and the periphery circuits are disposed. In the second region 538 the BPF 514 and the periphery circuits are disposed. In this example the BPF 514 has a length of 3 mm and a width of 6 mm. In this example the first region 537 has a length of 13 mm and a width of 10 mm, and the second region 538 has a length of 5 mm and a width of 10 mm.

The front end module 302 of the embodiment of the invention occupies a smaller area than the reference front end module.

As thus described, the front end module 302 of the embodiment comprises: the diplexer 310 for separating the AMPS band from the PCS band; the duplexer 312 for separating transmission signals and reception signals in the AMPS band from each other; the duplexer 313 for separating transmission signals and reception signals in the PCS band from each other; and the BPF 314 for selectively allowing reception signals of the GPS to pass therethrough. The duplexer 312 includes the two acoustic wave elements each of which functions as a filter. The duplexer 313 includes the two acoustic wave elements each of which functions as a filter, too. In the embodiment the diplexer 310, the duplexers 312 and 313, and the BPF 314 are integrated on the multi-layer substrate 430. The diplexer 310 is made up of the conductor layer located inside or on the surface of the multi-layer substrate 430.

According to the embodiment as thus described, the front end module 302 achieves processing of transmission signals and reception signals in each of the AMPS band and the PCS band, and reception signals of the GPS. According to the embodiment, the duplexers 312 and 313 are used to separate transmission signals and reception signals from each other, so that the front end module 302 is operable in the code division multiple access system. In addition, according to the embodiment, it is possible to implement the front end module 302 that easily achieves a reduction in size and weight, and combination and integration of components.

According to the embodiment, the chips 431 and 432 including the surface acoustic wave elements used in the BPFs 405 and 407 of the duplexer 312 are mounted on the top surface of the multi-layer substrate 430, and the chips 433 and 434 including the surface acoustic wave elements used in the BPFs 405 and 407 of the duplexer 313 are also mounted on the top surface of the multi-layer substrate 430. In addition, at least part of the circuit portions of the duplexers 312 and 313 except the surface acoustic wave elements is made up of the conductor layers located inside or on the surface of the multi-layer substrate 430. As a result, a further reduction in size and weight of the front end module 302 is achieved.

According to the embodiment, the duplexers 312 and 313 including the acoustic wave elements are integrated with the diplexer 310, so that the impedance matching between each of the duplexers 312 and 313 and the periphery circuits is optimized. As a result, an improvement in performance of the front end module 302 is achieved, too.

The present invention is not limited to the foregoing embodiments but may be practiced in still other ways. For example, according to the embodiments, the chip including the acoustic wave elements used in the transmission-side BPF of the duplexer is separated from the chip including the acoustic wave elements used in the reception-side BPF of the duplexer. However, the two chips may be combined to form a single chip in the invention.

The combinations of the frequency bands employed in the embodiments are given by way of example and the invention is applicable to any other combination of frequency bands.

As thus described, the front end module of the invention comprises: the first separating means for separating the first and second frequency bands from each other; the second separating means for separating transmission signals and reception signals in the first frequency band from each other; and the third separating means for separating transmission signals and reception signals in the second frequency band from each other. The second separating means includes the two acoustic wave elements each of which functions as a filter. The third separating means includes the two acoustic wave elements each of which functions as a filter, too. The single multi-layer substrate is used to integrate the first to third separating means. The first separating means is made up of the conductor layer located inside or on the surface of the multi-layer substrate. As a result, the invention implements the front end module that is capable of processing transmission signals and reception signals in each of the first and second frequency bands and operable in the code division multiple access system, and that easily achieves a reduction in size and weight, and combination and integration of components.

According to the front end module of the invention, the two acoustic wave elements that the second separating means includes and the two acoustic wave elements that the third separating means includes may be mounted on the multi-layer substrate for integration. In addition, at least part of the circuit portions of the second and third separating means except the acoustic wave elements may be made up of the conductor layers located inside or on the surface of the multi-layer substrate. In this case, a further reduction in size and weight of the front end module is achieved.

Obviously many modifications and variations of the present invention are possible in the light of the above teachings. It is therefore to be understood that within the scope of the appended claims the invention may be practiced otherwise than as specifically described.

What is claimed is:

1. A front end module for processing transmission signals and reception signals in each of a first frequency band and a second frequency band, the front end module comprising:

first separating means for separating the first and second frequency bands from each other, where the first separating means is connected to an antenna;

second separating means for separating the transmission signals and the reception signals in the first frequency band from each other, where the second separating means is connected to the first separating means and includes a first pair of two acoustic wave elements each of which functions as a filter;

third separating means for separating the transmission signals and the reception signals in the second frequency band from each other, where the third separating means is connected to the first separating means and includes a second pair of two acoustic wave elements each of which functions as a filter, wherein each of the acoustic wave elements in the first and second pairs of two acoustic wave elements is one of a surface acoustic wave element and a bulk acoustic wave element; and a single multi-layer substrate that integrates the first to third separating means wherein:

the first separating means is made up of a conductor layer located inside or on a surface of the multi-layer substrate wherein:

the first separating means includes a filter;

one of the second and third separating means includes a delay line for impedance adjustment that is provided between one of the two acoustic wave elements included in the one of the second and third separating means and the first separating means;

the first pair of two acoustic wave elements and the second pair of two acoustic wave elements are mounted on a top surface of the multi-layer substrate; and the multi-layer substrate includes, as conductor layers located inside the multi-layer substrate, a ground layer, a conductor layer that forms the delay line and that is disposed between the ground layer and the top surface of the multi-layer substrate; and a conductor layer that forms the filter included in the first separating means and that is disposed between the ground layer and a bottom surface of the multi-layer substrate, the front end module further comprising a terminal disposed on the bottom surface of the multi-layer substrate and connected to the conductor layer that forms the filter included in the first separating means.

2. The front end module according to claim 1, further comprising a matching circuit provided between the delay line and the first separating means, wherein the multi-layer substrate further includes, as another conductor layer located inside the multi-layer substrate, a conductor layer that forms the matching circuit and that is disposed between the ground layer and the top surface of the multi-layer substrate.

* * * * *